(12) United States Patent
Wang et al.

(10) Patent No.: US 8,537,543 B2
(45) Date of Patent: Sep. 17, 2013

(54) PORTABLE ELECTRONIC DEVICE HOUSING STRUCTURES

(75) Inventors: Erik L. Wang, Redwood City, CA (US); Phillip M. Hobson, Menlo Park, CA (US); Kenneth A. Jenks, Cupertino, CA (US); Adam D. Mittleman, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 520 days.

(21) Appl. No.: 12/135,139

(22) Filed: Jun. 6, 2008

(65) Prior Publication Data
US 2009/0257189 A1  Oct. 15, 2009

Related U.S. Application Data

(60) Provisional application No. 61/044,445, filed on Apr. 11, 2008.

(51) Int. Cl.
*H05K 5/00* (2006.01)
*H05K 7/00* (2006.01)
*H04M 1/00* (2006.01)

(52) U.S. Cl.
USPC ............ 361/679.56; 361/679.26; 361/679.57; 361/679.58; 455/575.1; 455/575.3; 455/575.8

(58) Field of Classification Search
USPC ............. 361/679.01, 679.02, 679.08, 679.09, 361/679.3, 679.55–679.59; 345/156, 157, 345/168, 169; 455/575.1, 575.3, 575.4, 575.8; 340/384.71, 566; 200/239; 174/535; 29/557
See application file for complete search history.

(56) References Cited

U.S. PATENT DOCUMENTS

| | | | |
|---|---|---|---|
| 6,028,765 A * | 2/2000 | Swindler et al. | ......... 361/679.55 |
| 6,178,318 B1 * | 1/2001 | Holmberg et al. | ............ 455/300 |
| 6,483,719 B1 | 11/2002 | Bachman | |
| 6,808,239 B1 | 10/2004 | Bader | |
| 7,013,558 B2 | 3/2006 | Bachman | |
| 2003/0087611 A1 * | 5/2003 | Pan | ................................. 455/90 |
| 2003/0184514 A1 * | 10/2003 | Grosfeld et al. | ............. 345/156 |
| 2004/0174665 A1 | 9/2004 | Mockridge et al. | |
| 2004/0203518 A1 | 10/2004 | Zheng et al. | |

(Continued)

FOREIGN PATENT DOCUMENTS
KR   100 810 266 B1   3/2008

OTHER PUBLICATIONS

U.S. Appl. No. 12/119,986, filed May 13, 2008, Wang et al.

*Primary Examiner* — Jayprakash N Gandhi
*Assistant Examiner* — Jerry Wu
(74) *Attorney, Agent, or Firm* — Treyz Law Group; G. Victor Treyz; David C. Kellogg

(57) ABSTRACT

Portable electronic devices are provided. Each device may be formed from two parts. A first part may be provided with components such as a display, a touch screen, a cover glass, and a frame. A second part may be provided with a plastic housing, circuit boards containing electrical components, and a bezel. Engagement members may be connected to the first and second parts. The engagement members may be formed from metal clips with holes and springs with flexible spring prongs that mate with the holes in the clips. The metal clips may be welded to frame struts on the frame and the springs may be welded to the bezel. Hard stop structures may be used to vertically align the first and second parts. A frame in the device may have an integral gasket.

13 Claims, 33 Drawing Sheets

(56) References Cited

U.S. PATENT DOCUMENTS

| | | |
|---|---|---|
| 2005/0041378 A1* | 2/2005 | Hamada et al. ............... 361/680 |
| 2006/0012969 A1 | 1/2006 | Bachman |
| 2006/0148425 A1 | 7/2006 | Carlson |
| 2006/0292439 A1* | 12/2006 | Zuo et al. ....................... 429/97 |
| 2007/0012489 A1* | 1/2007 | Kim et al. .................. 178/18.01 |
| 2007/0052100 A1 | 3/2007 | Bellinger |
| 2007/0153471 A1* | 7/2007 | Chen et al. .................... 361/685 |
| 2007/0298272 A1* | 12/2007 | Kusakawa et al. ............ 428/515 |
| 2008/0146293 A1 | 6/2008 | Kim |

\* cited by examiner

PORTABLE ELECTRONIC DEVICE HOUSING STRUCTURES

This application claims the benefit of provisional patent application No. 61/044,445, filed Apr. 11, 2008, which is hereby incorporated by reference herein in its entirety.

BACKGROUND

This invention relates generally to portable electronic devices, and more particularly, to portable electronic devices such as handheld electronic devices.

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

To satisfy consumer demand for small form factor devices such as handheld electronic devices, manufacturers are continually striving to reduce the size of components that are used in these devices while providing enhanced functionality. Significant enhancements may be difficult to implement, however, particularly in devices in which numerous components are used.

It would therefore be desirable to be able to provide improved handheld electronic devices.

SUMMARY

A portable electronic device such as a handheld electronic device is provided. The device may be formed from a tilt assembly and a housing assembly. During manufacturing, the tilt assembly may be inserted into the housing assembly.

The tilt assembly may include a frame. The frame may have a plastic frame member that is overmolded on top of metal frame struts. A planar mid-plate member may be connected to the frame to provide additional rigidity. Retention clips may be connected to one end of the frame. Threads in the retention clips may receive screws that may be used in securing the tilt assembly to the housing assembly.

Components such as a display unit, touch sensor, and cover glass may be mounted within the frame.

The housing assembly may include a plastic housing member, a bezel connected to the plastic housing member, and electrical components mounted within the plastic housing such as printed circuit boards, integrated circuits, etc.

Engagement members may be connected to the tilt assembly and housing assembly. During assembly, the engagement members may nondestructively engage one another to hold the tilt assembly within the housing assembly. In this configuration, the top surface of the cover glass may lie flush with the bezel on the housing assembly. The bezel may surround the cover glass. The frame may have a protrusion that surrounds the cover glass. The protrusion and other portions of the frame may form a shelf that supports the cover glass. To protect the cover glass from scratches due to contact with the bezel, an elastomeric gasket may be interposed between the bezel and the cover glass. The gasket may be formed over the protrusion.

One or both of the engagement members may be flexible enough to allow the tilt assembly and the housing assembly to be taken apart without damaging the engagement members. This allows the portable electronic device to be disassembled for rework or repair operations.

The engagement members may include metal clips and metal springs. The metal clips may be welded to the frame struts. The metal springs may be welded to the bezel. The metal clips may have elongated planar members with cut-out portions. The cut-out portions may define holes and may be formed by bending planar portions of the elongated planar members so that they are angled inwardly. The bent planar portions of the clips form shelf-like members adjacent to the holes. The springs may have spring prongs that flex during assembly. Following assembly operations, the prongs protrude into the holes and hold the tilt assembly to the housing assembly. The prongs may have curved portions that bear against the planar shelf portions of the clips that are formed by the bent planar portions of the elongated members. The use of curves and the bent planar portions in the spring prongs and clip structures may help reduce harshness when inserting and removing the tilt assembly into the housing assembly and can improve mechanical tolerances. Mechanical tolerances may be further improved by incorporating a hard stop structure into the device. With one suitable arrangement, a plastic lower housing portion in the housing assembly may be provided with plastic protrusions against which the frame may bear. This helps to accurately define the vertical alignment of the tilt assembly relative to the housing assembly.

The frame may have an integral gasket. The gasket may be molded to the frame using an overmolding process. With one suitable arrangement, a plastic frame member may be overmolded on top of metal frame struts using a first shot of a two-shot overmolding process. An elastomeric gasket may be overmolded on top of the plastic frame member using a second shot of the two-shot overmolding process.

Further features of the invention, its nature and various advantages will be more apparent from the accompanying drawings and the following detailed description of the preferred embodiments.

DETAILED DESCRIPTION

The present invention relates generally to electronic devices, and more particularly, to portable electronic devices such as handheld electronic devices.

The electronic devices may be portable electronic devices such as laptop computers or small portable computers of the type that are sometimes referred to as ultraportables. Portable electronic devices may also be somewhat smaller devices. Examples of smaller portable electronic devices include wrist-watch devices, pendant devices, headphone and earpiece devices, and other wearable and miniature devices. With one suitable arrangement, the portable electronic devices may be wireless electronic devices.

The wireless electronic devices may be, for example, handheld wireless devices such as cellular telephones, media players with wireless communications capabilities, handheld computers (also sometimes called personal digital assistants), remote controllers, global positioning system (GPS) devices, and handheld gaming devices. The wireless electronic devices may also be hybrid devices that combine the functionality of multiple conventional devices. Examples of hybrid portable electronic devices include a cellular telephone that includes media player functionality, a gaming device that includes a wireless communications capability, a cellular telephone that includes game and email functions, and a portable device that receives email, supports mobile telephone calls, has music player functionality and supports web browsing. These are merely illustrative examples.

Figure 1:
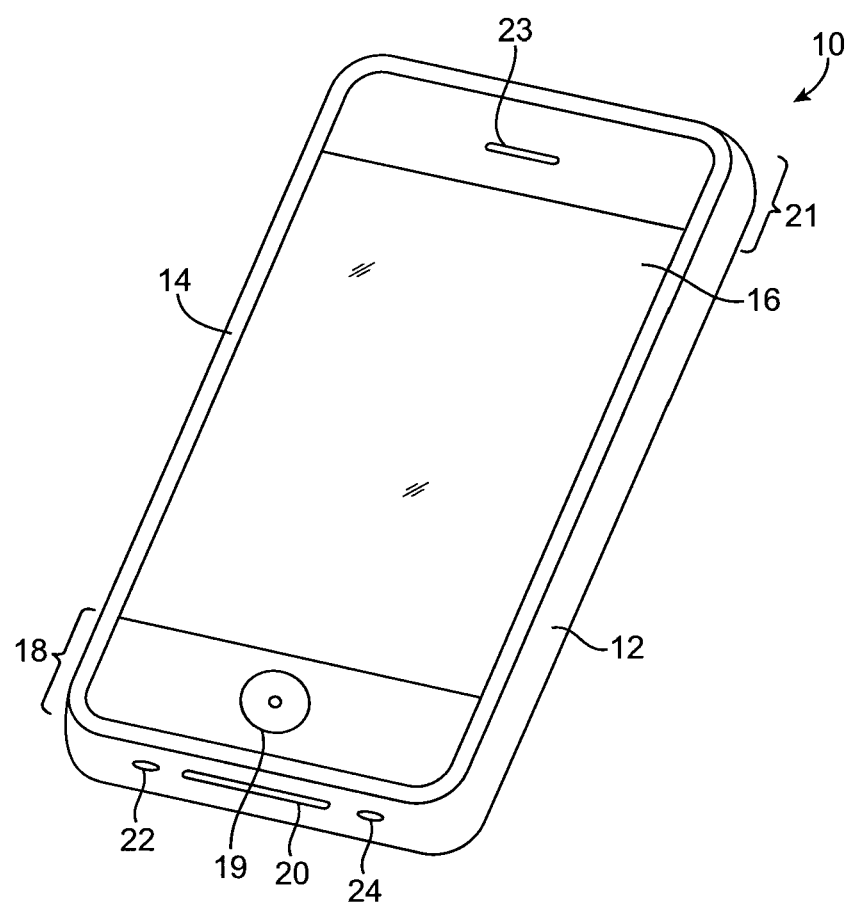
FIG. 1 is a perspective view of an illustrative portable electronic device in accordance with an embodiment of the present invention.

An illustrative portable electronic device in accordance with an embodiment of the present invention is shown in FIG. 1. Device 10 of FIG. 1 may be, for example, a handheld electronic device that supports 2G and/or 3G cellular telephone and data functions, global positioning system capabilities, and local wireless communications capabilities (e.g., IEEE 802.11 and Bluetooth®) and that supports handheld computing device functions such as internet browsing, email and calendar functions, games, music player functionality, etc.

Device 10 may have housing 12. Antennas for handling wireless communications may be housed within housing 12 (as an example).

Housing 12, which is sometimes referred to as a case, may be formed of any suitable materials including, plastic, glass, ceramics, metal, or other suitable materials, or a combination of these materials. In some situations, housing 12 or portions of housing 12 may be formed from a dielectric or other low-conductivity material, so that the operation of conductive antenna elements that are located in proximity to housing 12 is not disrupted. Housing 12 or portions of housing 12 may also be formed from conductive materials such as metal. An advantage of forming housing 12 from a dielectric material such as plastic is that this may help to reduce the overall weight of device 10 and may avoid potential interference with wireless operations.

In scenarios in which housing 12 is formed from metal elements, one or more of the metal elements may be used as part of the antennas in device 10. For example, metal portions of housing 12 may be shorted to an internal ground plane in device 10 to create a larger ground plane element for that device 10.

Housing 12 may have a bezel 14. The bezel 14 may be formed from a conductive material or other suitable material. Bezel 14 may serve to hold a display or other device with a planar surface in place on device 10 and/or may serve to form an esthetically pleasing trim around the edge of device 10. As shown in FIG. 1, for example, bezel 14 may be used to surround the top of display 16. Bezel 14 and/or other metal elements associated with device 10 may be used as part of the antennas in device 10. For example, bezel 14 may be shorted to printed circuit board conductors or other internal ground plane structures in device 10 to create a larger ground plane element for device 10.

Display 16 may be a liquid crystal display (LCD), an organic light emitting diode (OLED) display, or any other suitable display. The outermost surface of display 16 may be formed from one or more plastic or glass layers. If desired, touch screen functionality may be integrated into display 16 or may be provided using a separate touch pad device. An advantage of integrating a touch screen into display 16 to make display 16 touch sensitive is that this type of arrangement can save space and reduce visual clutter.

Display screen 16 (e.g., a touch screen) is merely one example of an input-output device that may be used with electronic device 10. If desired, electronic device 10 may have other input-output devices. For example, electronic device 10 may have user input control devices such as button 19, and input-output components such as port 20 and one or more input-output jacks (e.g., for audio and/or video). Button 19 may be, for example, a menu button. Port 20 may contain a 30-pin data connector (as an example). Openings 22 and 24 may, if desired, form speaker and microphone ports. Speaker port 22 may be used when operating device 10 in speakerphone mode. Opening 23 may also form a speaker port. For example, speaker port 23 may serve as a telephone receiver that is placed adjacent to a user's ear during operation. In the example of FIG. 1, display screen 16 is shown as being mounted on the front face of handheld electronic device 10, but display screen 16 may, if desired, be mounted on the rear face of handheld electronic device 10, on a side of device 10, on a flip-up portion of device 10 that is attached to a main body portion of device 10 by a hinge (for example), or using any other suitable mounting arrangement.

A user of electronic device 10 may supply input commands using user input interface devices such as button 19 and touch screen 16. Suitable user input interface devices for electronic device 10 include buttons (e.g., alphanumeric keys, power on-off, power-on, power-off, and other specialized buttons, etc.), a touch pad, pointing stick, or other cursor control device, a microphone for supplying voice commands, or any other suitable interface for controlling device 10. Although shown schematically as being formed on the top face of electronic device 10 in the example of FIG. 1, buttons such as button 19 and other user input interface devices may generally be formed on any suitable portion of electronic device 10. For example, a button such as button 19 or other user interface control may be formed on the side of electronic device 10. Buttons and other user interface controls can also be located on the top face, rear face, or other portion of device 10. If desired, device 10 can be controlled remotely (e.g., using an infrared remote control, a radio-frequency remote control such as a Bluetooth® remote control, etc.).

Electronic device 10 may have ports such as port 20. Port 20, which may sometimes be referred to as a dock connector, 30-pin data port connector, input-output port, or bus connector, may be used as an input-output port (e.g., when connecting device 10 to a mating dock connected to a computer or other electronic device). Port 20 may contain pins for receiving data and power signals. Device 10 may also have audio and video jacks that allow device 10 to interface with external components. Typical ports include power jacks to recharge a battery within device 10 or to operate device 10 from a direct current (DC) power supply, data ports to exchange data with external components such as a personal computer or peripheral, audio-visual jacks to drive headphones, a monitor, or other external audio-video equipment, a subscriber identity module (SIM) card port to authorize cellular telephone service, a memory card slot, etc. The functions of some or all of these devices and the internal circuitry of electronic device 10 can be controlled using input interface devices such as touch screen display 16.

Components such as display 16 and other user input interface devices may cover most of the available surface area on the front face of device 10 (as shown in the example of FIG. 1) or may occupy only a small portion of the front face of device 10. Because electronic components such as display 16 often contain large amounts of metal (e.g., as radio-frequency shielding), the location of these components relative to the antenna elements in device 10 should generally be taken into consideration. Suitably chosen locations for the antenna elements and electronic components of the device will allow the antennas of electronic device 10 to function properly without being disrupted by the electronic components.

Examples of locations in which antenna structures may be located in device 10 include region 18 and region 21. These are merely illustrative examples. Any suitable portion of device 10 may be used to house antenna structures for device 10 if desired.

Figure 2:
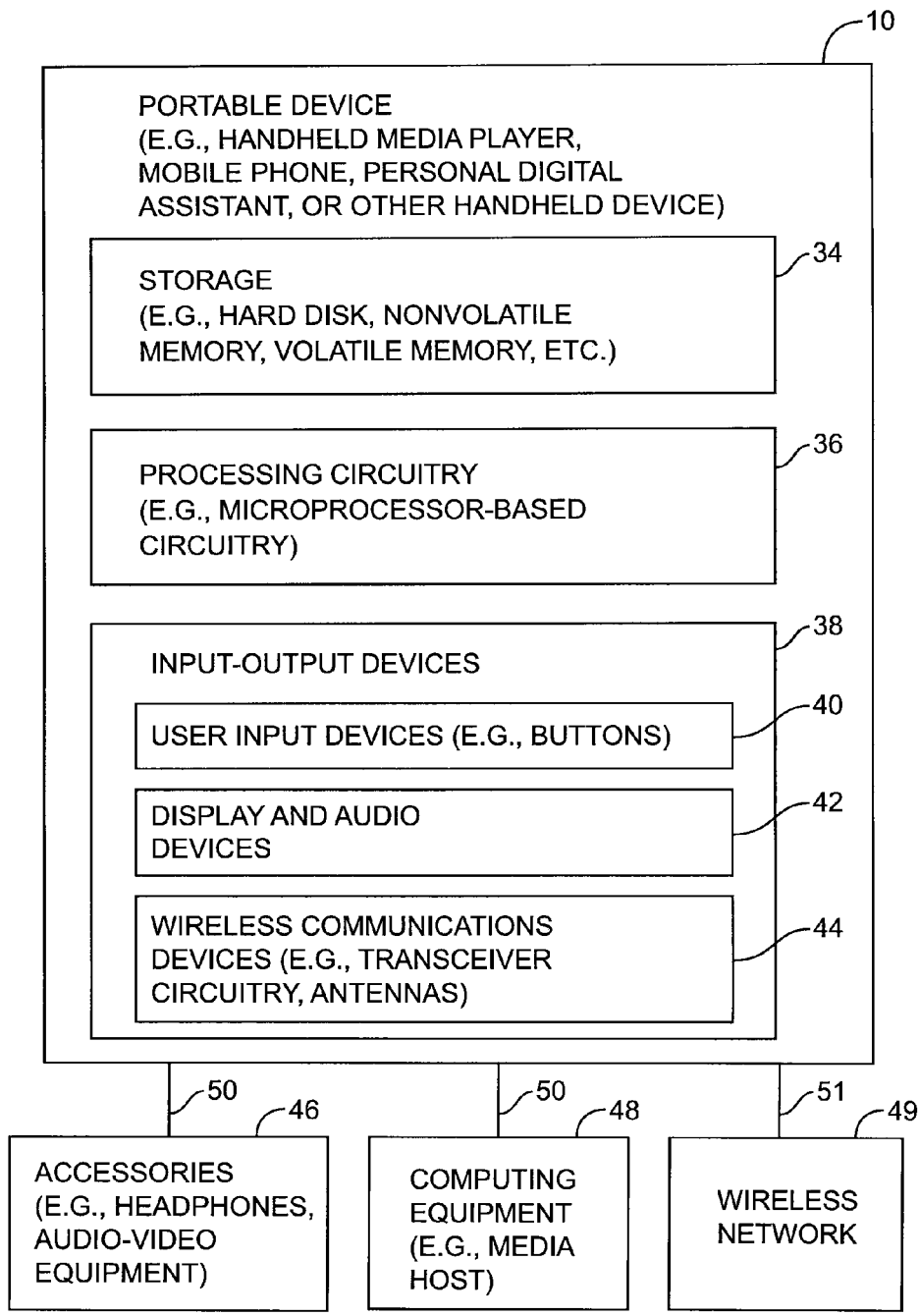
FIG. 2 is a schematic diagram of an illustrative portable electronic device in accordance with an embodiment of the present invention.

A schematic diagram of an embodiment of an illustrative portable electronic device such as a handheld electronic device is shown in FIG. 2. Portable device 10 may be a mobile telephone, a mobile telephone with media player capabilities, a handheld computer, a remote control, a game player, a global positioning system (GPS) device, a laptop computer, a tablet computer, an ultraportable computer, a hybrid device that includes the functionality of some or all of these devices, or any other suitable portable electronic device.

As shown in FIG. 2, device 10 may include storage 34. Storage 34 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 36 may be used to control the operation of device 10. Processing circuitry 36 may be based on a processor such as a microprocessor and other suitable integrated circuits. With one suitable arrangement, processing circuitry 36 and storage 34 are used to run software on device 10, such as internet browsing applications, voice-over-internet-protocol (VOIP) telephone call applications, email applications, media playback applications, operating system functions, etc. Processing circuitry 36 and storage 34 may be used in implementing suitable communications protocols. Communications protocols that may be implemented using processing circuitry 36 and storage 34 include internet protocols, wireless local area network protocols (e.g., IEEE 802.11 protocols—sometimes referred to as Wi-Fi®), protocols for other short-range wireless communications links such as the Bluetooth® protocol, protocols for handling 3G communications services (e.g., using wide band code division multiple access techniques), 2G cellular telephone communications protocols, etc.

To minimize power consumption, processing circuitry 36 may include power management circuitry to implement power management functions. During operation, the power management circuitry or other processing circuitry 36 may be used to adjust power supply voltages that are provided to portions of the circuitry on device 10. For example, higher direct-current (DC) power supply voltages may be supplied to active circuits and lower DC power supply voltages may be supplied to circuits that are less active or that are inactive.

Input-output devices 38 may be used to allow data to be supplied to device 10 and to allow data to be provided from device 10 to external devices. Display screen 16, button 19, microphone port 24, speaker port 22, and dock connector port 20 are examples of input-output devices 38.

Input-output devices 38 can include user input-output devices 40 such as buttons, touch screens, joysticks, click wheels, scrolling wheels, touch pads, key pads, keyboards, microphones, cameras, etc. A user can control the operation of device 10 by supplying commands through user input devices 40. Display and audio devices 42 may include liquid-crystal display (LCD) screens or other screens, light-emitting diodes (LEDs), and other components that present visual information and status data. Display and audio devices 42 may also include audio equipment such as speakers and other devices for creating sound. Display and audio devices 42 may contain audio-video interface equipment such as jacks and other connectors for external headphones and monitors.

Wireless communications devices 44 may include communications circuitry such as radio-frequency (RF) transceiver circuitry formed from one or more integrated circuits, power amplifier circuitry, passive RF components, antennas, and other circuitry for handling RF wireless signals. Wireless signals can also be sent using light (e.g., using infrared communications).

Device 10 can communicate with external devices such as accessories 46, computing equipment 48, and wireless network 49 as shown by paths 50 and 51. Paths 50 may include wired and wireless paths. Path 51 may be a wireless path. Accessories 46 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 48 may be any suitable computer. With one suitable arrangement, computing equipment 48 is a computer that has an associated wireless access point (router) or an internal or external wireless card that establishes a wireless connection with device 10. The computer may be a server (e.g., an internet server), a local area network computer with or without internet access, a user's own personal computer, a peer device (e.g., another portable electronic device 10), or any other suitable computing equipment.

Wireless network 49 may include any suitable network equipment, such as cellular telephone base stations, cellular towers, wireless data networks, computers associated with wireless networks, etc. For example, wireless network 49 may include network management equipment that monitors the wireless signal strength of the wireless handsets (cellular telephones, handheld computing devices, etc.) that are in communication with network 49.

The antenna structures and wireless communications devices of device 10 may support communications over any suitable wireless communications bands. For example, wireless communications devices 44 may be used to cover communications frequency bands such as cellular telephone voice and data bands at 850 MHz, 900 MHz, 1800 MHz, 1900 MHz, and 2100 MHz (as examples). Devices 44 may also be used to handle the Wi-Fi® (IEEE 802.11) bands at 2.4 GHz and 5.0 GHz (also sometimes referred to as wireless local area network or WLAN bands), the Bluetooth® band at 2.4 GHz, and the global positioning system (GPS) band at 1575 MHz.

Device 10 can cover these communications bands and/or other suitable communications bands with proper configuration of the antenna structures in wireless communications circuitry 44. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands. As an example, a pentaband cellular telephone antenna may be provided at one end of device 10 (e.g., in region 18) to handle 2G and 3G voice and data signals and a dual band antenna may be provided at another end of device 10 (e.g., in region 21) to handle GPS and 2.4 GHz signals. The pentaband antenna may be used to cover wireless bands at 850 MHz, 900 MHz, 1800 MHz, 1900 MHz, and 2100 MHz (as an example). The dual band antenna 63 may be used to handle 1575 MHz signals for GPS operations and 2.4 GHz signals (for Bluetooth® and IEEE 802.11 operations). These are merely illustrative arrangements. Any suitable antenna structures may be used in device 10 if desired.

To facilitate manufacturing operations, device 10 may be formed from two intermediate assemblies, representing upper and lower portions of device 10. The upper or top portion of device 10 is sometimes referred to as a tilt assembly. The lower or bottom portion of device 10 is sometimes referred to as a housing assembly.

The tilt and housing assemblies are each formed from a number of smaller components. For example, the tilt assembly may be formed from components such as display 16 and an associated touch sensor. The housing assembly may include a plastic housing portion 12 and printed circuit boards. Integrated circuits and other components may be mounted on the printed circuit boards.

During initial manufacturing operations, the tilt assembly is formed from its constituent parts and the housing assembly is formed from its constituent parts. Because essentially all components in device 10 make up part of these two assemblies, the finished assemblies represent a nearly complete version of device 10. The finished assemblies may, if desired, be tested. If testing reveals a defect, repairs may be made or defective assemblies may be discarded. During a final set of manufacturing operations, the tilt assembly is inserted into the housing assembly. With one suitable arrangement, one end of the tilt assembly is inserted into the housing assembly. The tilt assembly is then rotated ("tilted") into place so that the upper surface of the tilt assembly lies flush with the upper edges of the housing assembly.

As the tilt assembly is rotated into place within the housing assembly, clips on the tilt assembly engage springs on the housing assembly. The clips and springs form a detent that helps to align the tilt assembly properly with the housing assembly. Should rework or repair be necessary, the insertion process can be reversed by rotating the tilt assembly up and away from the housing assembly. During rotation of the tilt assembly relative to the housing assembly, the springs flex to accommodate movement. When the tilt assembly is located within the housing assembly, the springs press into holes in the clips to prevent relative movement between the tilt and housing assemblies. Rework and repair operations need not be destructive to the springs, clips, and other components in the device. This helps to prevent waste and complications that might otherwise interfere with the manufacturing of device 10.

If desired, screws or other fasteners may be used to help secure the tilt assembly to the housing assembly. The screws may be inserted into the lower end of device 10. With one suitable arrangement, the screws are inserted in an unobtrusive portion of the end of device 10 so that they are not noticeable following final assembly operations. Prior to rework or repair operations, the screws can be removed from device 10.

Figure 3:
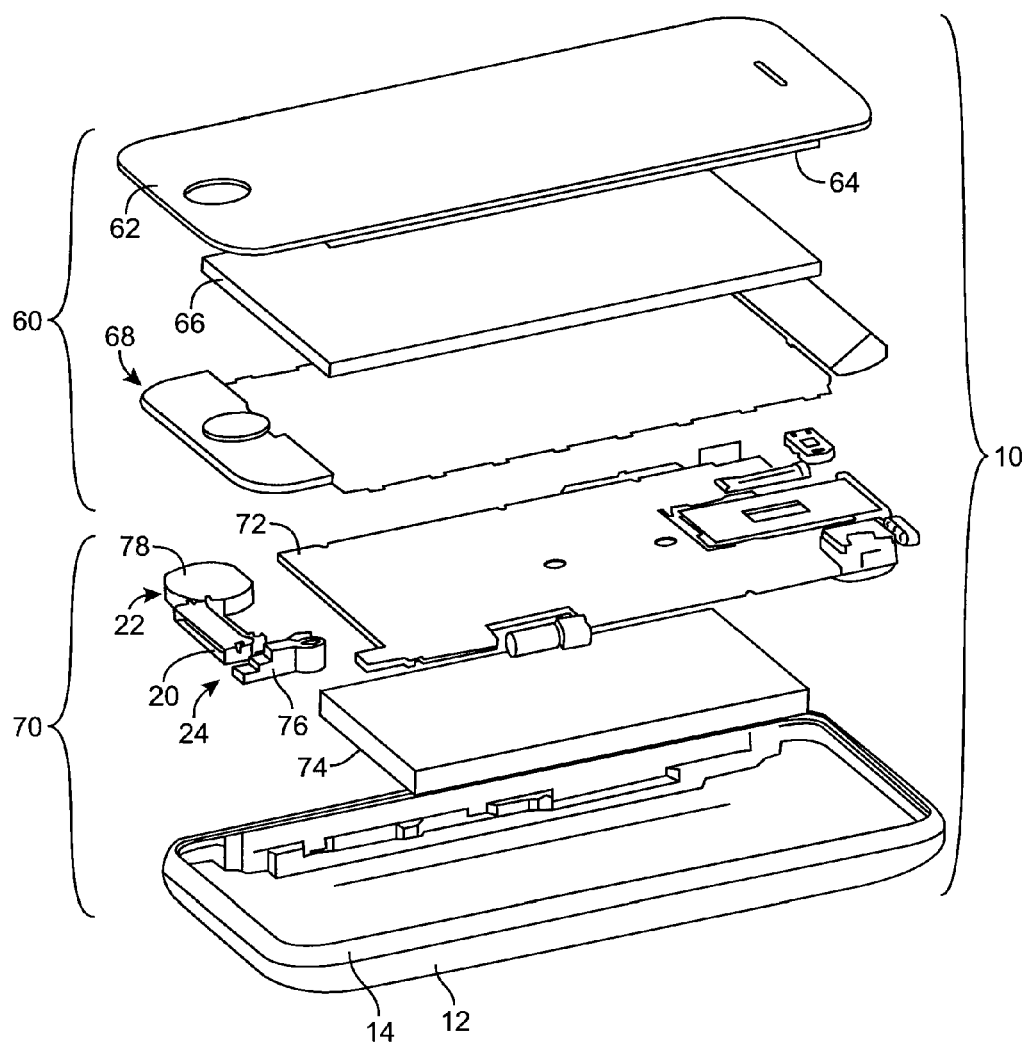
FIG. 3 is an exploded perspective view of an illustrative portable electronic device in accordance with an embodiment of the present invention.

An exploded perspective view showing illustrative components of device 10 is shown in FIG. 3.

Tilt assembly 60 (shown in its unassembled state in FIG. 3) may include components such as cover 62, touch sensitive sensor 64, display unit 66, and frame 68. Cover 62 may be formed of glass or other suitable transparent materials (e.g., plastic, combinations of one or more glasses and one or more plastics, etc.). Display unit 66 may be, for example, a color liquid crystal display. Frame 68 may be formed from one or more pieces. With one suitable arrangement, frame 68 may include metal pieces to which plastic parts are connected using an overmolding process. If desired, frame 68 may be formed entirely from plastic or entirely from metal.

Housing assembly 70 (shown in its unassembled state in FIG. 3) may include housing 12. Housing 12 may be formed of plastic and/or other materials such as metal (metal alloys). For example, housing 12 may be formed of plastic to which metal members are mounted using fasteners, a plastic overmolding process, or other suitable mounting arrangement.

As shown in FIG. 3, handheld electronic device 10 may have a bezel such as bezel 14. Bezel 14 may be formed of plastic or other dielectric materials or may be formed from metal or other conductive materials. An advantage of a metal (metal alloy) bezel is that materials such as metal may provide bezel 14 with an attractive appearance and may be durable. If desired, bezel 14 may be formed from shiny plastic or plastic coated with shiny materials such as metal films.

Bezel 14 may be mounted to housing 12. Following final assembly, bezel 14 may surround the display of device 10 and may, if desired, help secure the display onto device 10. Bezel 14 may also serve as a cosmetic trim member that provides an attractive finished appearance to device 10.

Housing assembly 70 may include battery 74. Battery 74 may be, for example, a lithium polymer battery having a capacity of about 1300 mA-hours. Battery 74 may have spring contacts that allow battery 74 to be serviced.

Housing assembly 70 may also include one or more printed circuit boards such as printed circuit board 72. Components may be mounted to printed circuit boards such as microphone 76 for microphone port 24, speaker 78 for speaker port 22, and dock connector 20, integrated circuits, a camera, ear speaker, audio jack, buttons, SIM card slot, etc.

Figure 4:
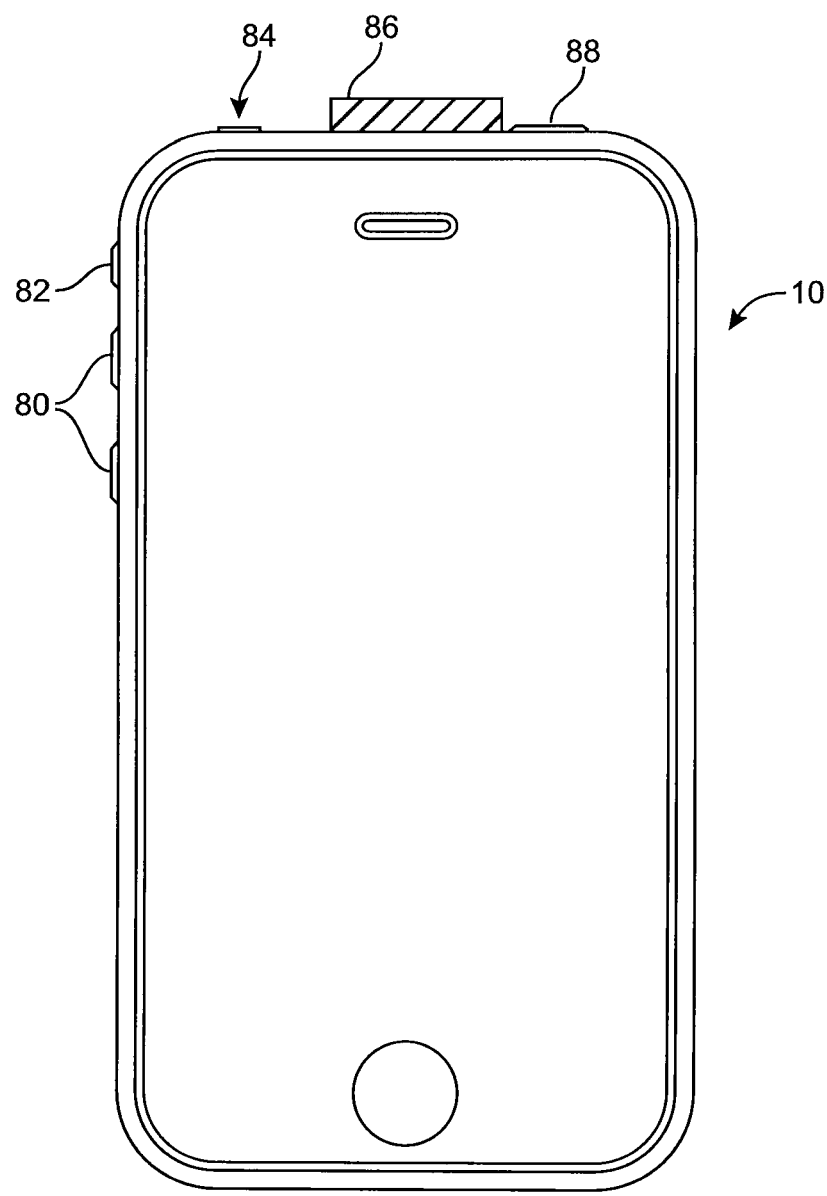
FIG. 4 is a top view of an illustrative portable electronic device in accordance with an embodiment of the present invention.

A top view of an illustrative device 10 is shown in FIG. 4. As shown in FIG. 4, device 10 may have controller buttons such as volume up and down buttons 80, a ringer A/B switch 82 (to switch device 10 between ring and vibrate modes), and a hold button 88 (sleep/wake button). A subscriber identity module (SIM) tray 86 (shown in a partially extended state) may be used to receive a SIM card for authorizing cellular telephone services. Audio jack 84 may be used for attaching audio peripherals to device 10 such as headphone, a headset, etc.

Figure 5:
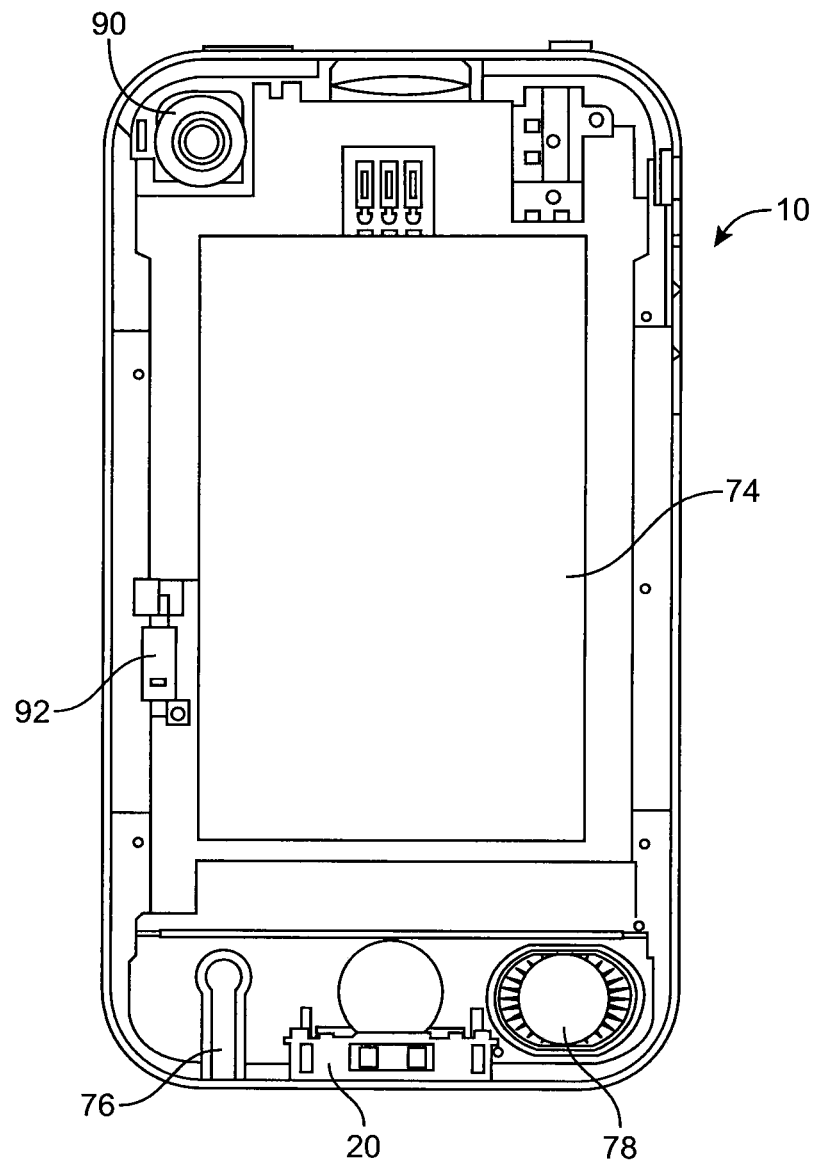
FIG. 5 is an interior bottom view of an illustrative portable electronic device in accordance with an embodiment of the present invention.

An interior bottom view of device 10 is shown in FIG. 5. As shown in FIG. 5, device 10 may have a camera 90. Camera 90 may be, for example, a two megapixel fixed focus camera.

Vibrator 92 may be used to vibrate device 10. Device 10 may be vibrated at any suitable time. For example, device 10 may be vibrated to alert a user to the presence of an incoming telephone call, an incoming email message, a calendar reminder, a clock alarm, etc.

Battery 74 may be a removable battery that is installed in the interior of device 10 adjacent to dock connector 20, microphone 76, and speaker 78.

Figure 6:
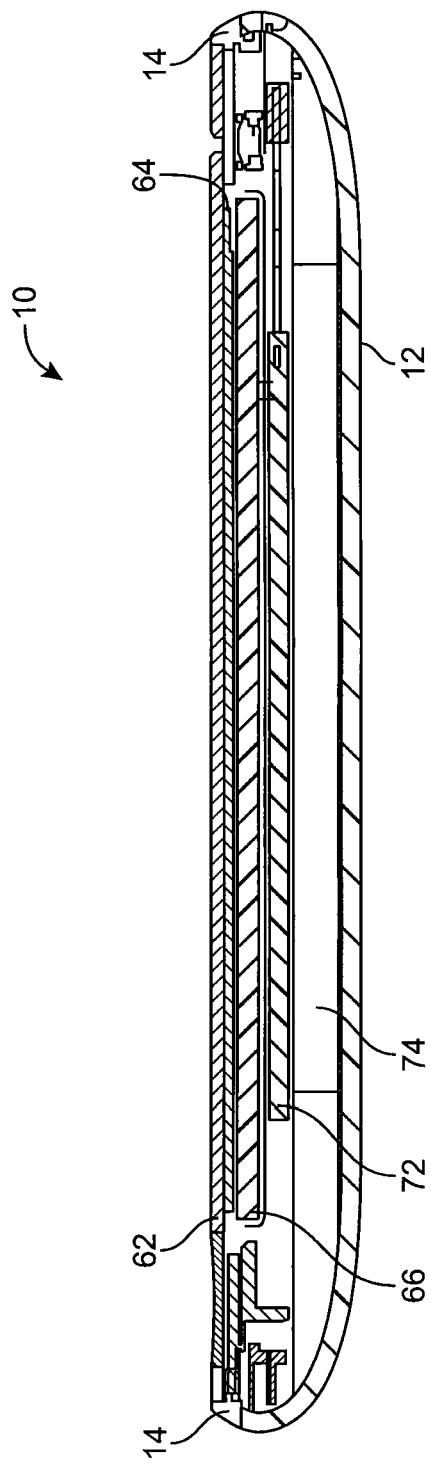
FIG. 6 is a side view of an illustrative portable electronic device in accordance with an embodiment of the present invention.

A cross-sectional side view of device 10 is shown in FIG. 6. FIG. 6 shows the relative vertical positions of device components such as housing 12, battery 74, printed circuit board 72, liquid crystal display unit 66, touch sensor 64, and cover glass 62 within device 10. FIG. 6 also shows how bezel 14 may surround the top edge of device 10 (e.g., around the portion of device 10 that contains the components of display 16 such as cover 62, touch screen 64, and display unit 66). Bezel 14 may be a separate component or, if desired, one or more bezel-shaped structures may be formed as integral parts of housing 12 or other device structures.

Figure 7:
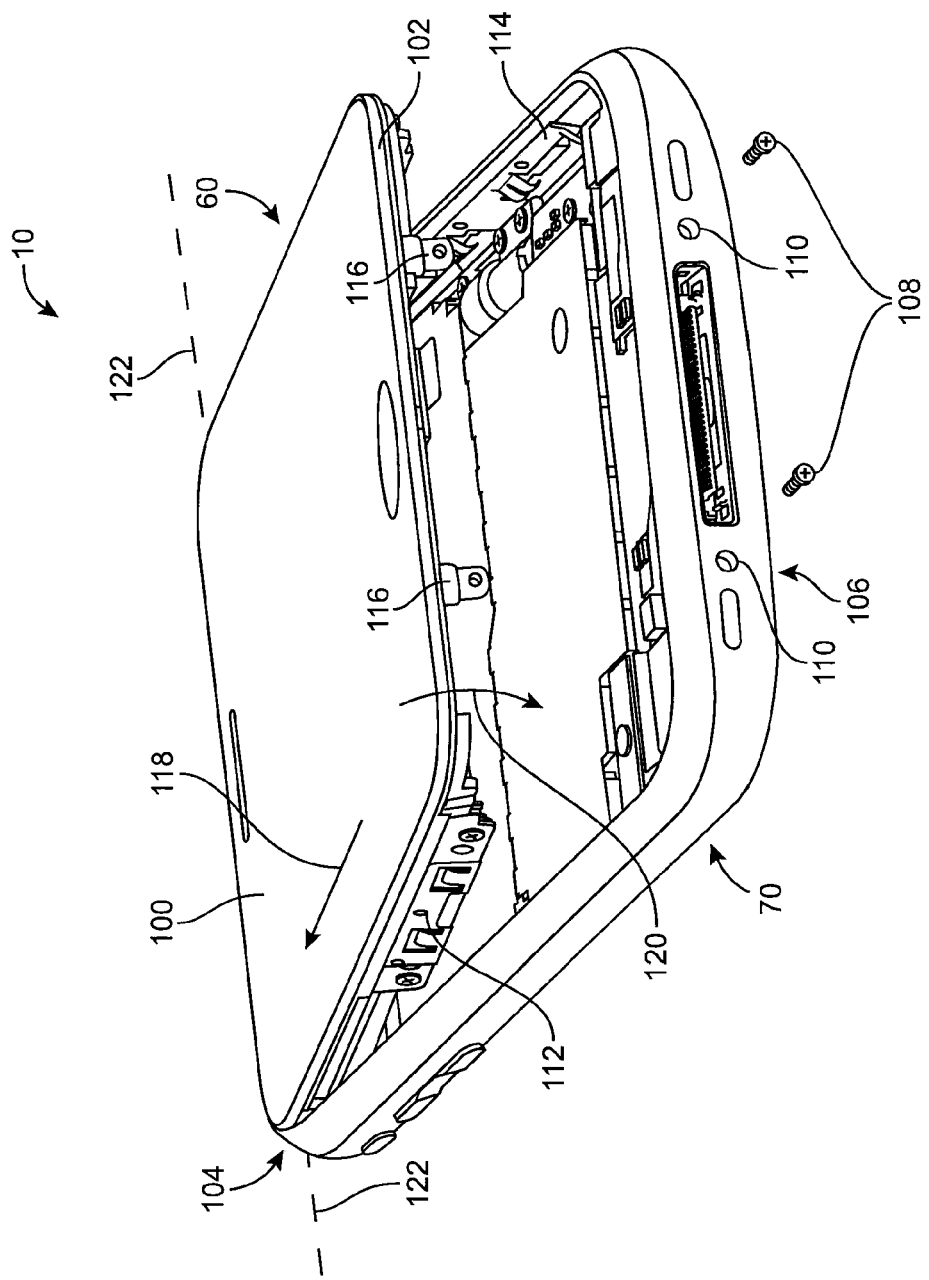
FIG. 7 is a perspective view of a partially assembled portable electronic device in accordance with an embodiment of the present invention showing how an upper portion of the device may be inserted into a lower portion of the device.
Figure 8:
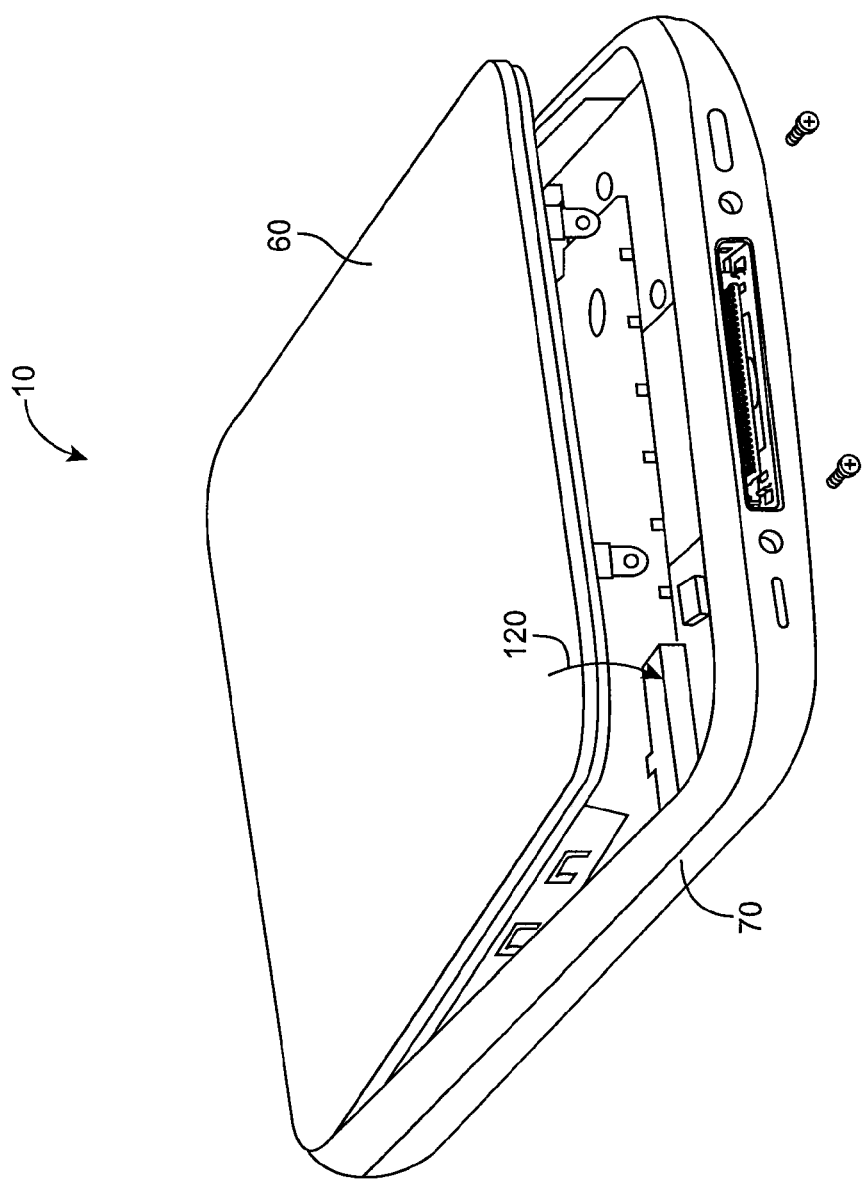
FIG. 8 is a perspective view of a partially assembled portable electronic device of the type shown in FIG. 7 in accordance with an embodiment of the present invention showing how the upper portion of the device may be tilted downwards into the lower portion of the device during assembly.
Figure 9:
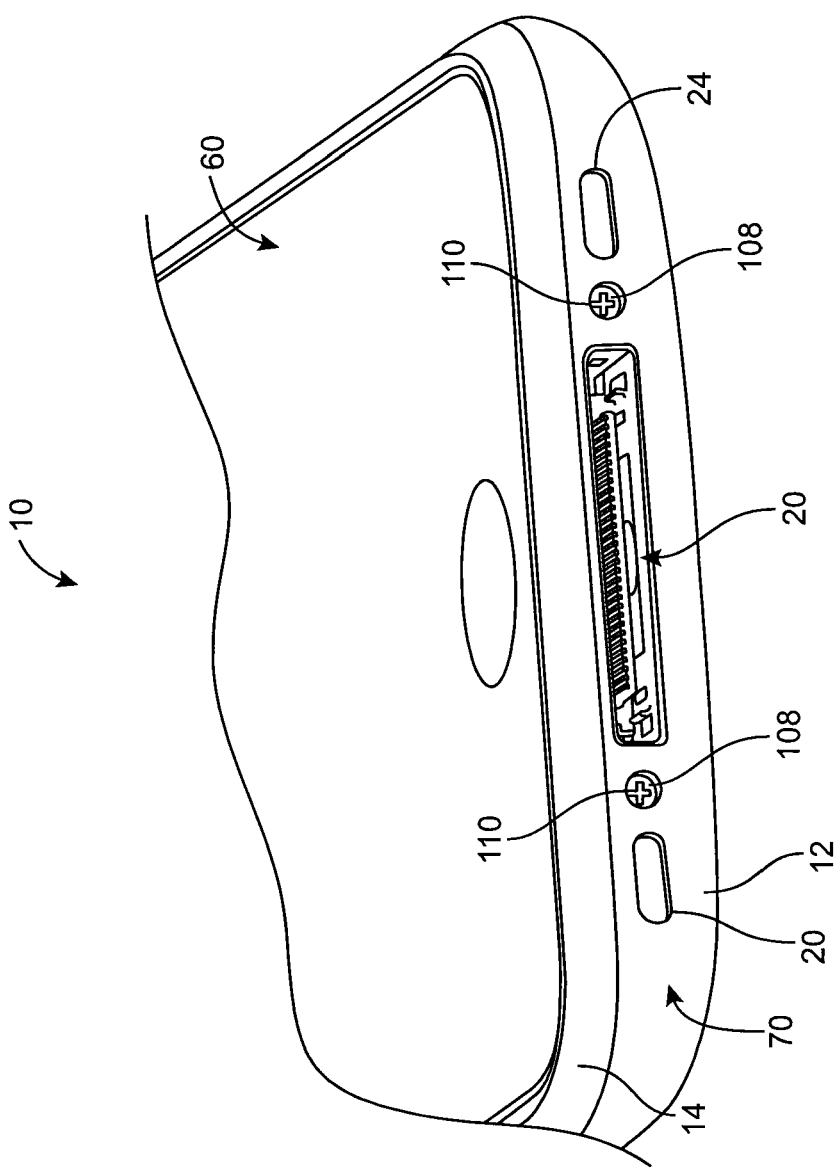
FIG. 9 is a perspective view of a fully assembled portable electronic device of the type shown in FIGS. 7 and 8 in accordance with an embodiment of the present invention.

An illustrative process for assembling device 10 from tilt assembly 60 and housing assembly 70 is shown in FIGS. 7, 8, and 9.

As shown in FIG. 7, the assembly process may begin by inserting upper end 100 of tilt assembly 60 into upper end 104 of housing assembly 70. This process involves inserting tilt assembly 60 into housing assembly 70 along direction 118 until protrusions (not shown in FIG. 7) on the upper end of tilt assembly 60 engage mating holes on housing assembly 70. Once the protrusions on tilt assembly 60 have engaged with housing assembly 70, lower end 102 of tilt assembly 60 may be inserted into lower end 106 of housing assembly 70. Lower end 102 may be inserted into lower end 106 by pivoting tilt assembly 60 about axis 122. This causes tilt assembly 60 to rotate into place as indicated by arrow 120.

Tilt assembly 60 may have clips such as clips 112 and housing assembly 70 may have matching springs 114. When tilt assembly 60 is rotated into place within housing assembly 70, the springs and clips mate with each other to hold tilt assembly 60 in place within housing assembly 70.

Tilt assembly 60 may have one or more retention clips such as retention clips 116. Retention clips 116 may have threaded holes that mate with screws 108. After tilt assembly has been inserted into housing assembly, screws 108 may be screwed into retention clips 116 through holes 110 in housing assembly 70. This helps to firmly secure tilt assembly 60 to housing assembly 70. Should rework or repair be desired, screws 108 may be removed from retention clips 116 and tilt assembly 60 may be released from housing assembly 70. During the removal of tilt assembly 60 from housing assembly 70, springs 114 may flex relative to clips 112 without permanently deforming. Because no damage is done to tilt assembly 60 or housing assembly 70 in this type of scenario, nondestructive rework and repair operations are possible.

FIG. 8 shows device 10 in a partially assembled state, in which tilt assembly 60 of FIG. 7 has been rotated further in direction 120 relative to housing assembly 70 than in the state of FIG. 7.

FIG. 9 shows device 10 in a fully assembled state in which tilt assembly 60 has been mounted within housing assembly 70 and in which screws 108 have been screwed into the retention clips on tilt assembly 60. As shown in FIG. 9, holes 110 may provide a recessed region so that the ends of screws 108 do not protrude beyond the outer surface of housing 12.

Figure 10:
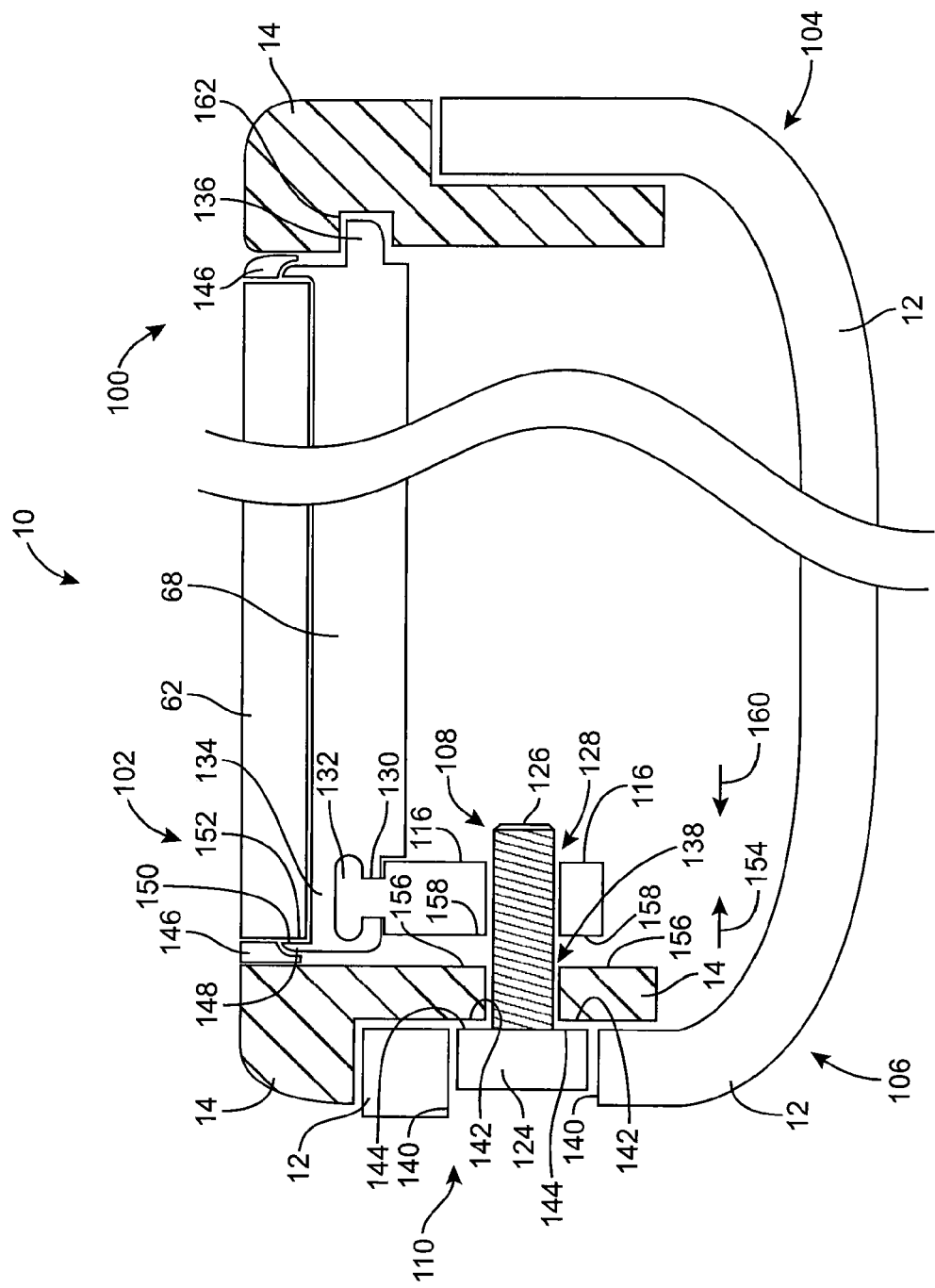
FIG. 10 is a cross-sectional side view of an illustrative portable electronic device in accordance with an embodiment of the present invention.

A cross-sectional side view of device 10 that shows how screws 108 may pass through bezel 14 is shown in FIG. 10. As shown in FIG. 10, screw 108 may have head 124 and tip 126. During assembly, a screwdriver or other tool engages a groove or other features on head 124 to rotate screw 108 into place. Hole 110 in housing 12 may be a through hole that provides radial clearance between the outer edges of head 124 and inner walls 140 of hole 110. Hole 138 in bezel 14 may be sized so that the underside of head 124 presses against bezel 14. In particular, hole 138 may have a diameter that is small enough to allow head surfaces 144 to bear against bezel surfaces 142. This pulls bezel 14 in direction 154. Retention clip 116 may have a threaded hole 128 into which tip 126 of screw 108 may be screwed. This pulls retention clip 116 in direction 160.

When screw 108 is tightened, bezel 14 and retention clip 116 are pulled towards each other. Bezel 14 is pulled in direction 154 and retention clip 116 is pulled in direction 160, so that inner bezel surface 156 of bezel 14 and outer retention clip surface 158 bear against each other. This helps to hold device 10 together and prevents unintentional removal of the tilt assembly from the housing assembly.

Retention clip 116 may be attached to frame 68 using any suitable technique (e.g., fasteners, adhesive, etc.). With one particularly suitable arrangement, which is illustrated in FIG. 10, retention clip 116 may have an upper end with enlarged portion 132 and constricted portion 130. Retention clip 116 may be formed from a durable material such as metal. (All metal parts in device 10 may be formed from elemental metals or metal alloys.) Frame 68 may be formed at least partly from a moldable material such as plastic. At end 102, the plastic of frame 68 in region 134 may be molded over enlarged portion 132 of retention clip 116, thereby holding retention clip to frame 68.

Frame 68 may have lip-shaped protrusions such as protrusions 148. Protrusions 148 may help form a shelf for cover glass 62. In particular, protrusions 148 may form a shelf with inner surfaces 150 that hold outer edges 152 of cover 62.

A gasket such as gasket 146 may be interposed between bezel 14 and the display of device 10. In particular, gasket 146 may be used to prevent cover glass 62 from directly bearing against bezel 14. This may help to prevent rubbing between bezel 14 and cover glass 62, thereby preventing chips or scratches from forming in cover glass 62. Gasket 146 may be formed of thermoplastic urethane (TPU), silicone, polyester film, or other soft plastic (as an example). Gasket 146 may have any suitable cross-sectional shape. For example, gasket 146 may have a circular cross section, gasket 146 may have a rectangular cross-section, etc. Gasket 146 may help to seal the surface of the display portion of device 10 to prevent debris from entering device 10. Gasket 146 may also help to center the display within bezel 14 and may help to hide potentially unsightly portions of the display from view. The cover glass portion of display 16 may have one or more holes or cut-away portions. For example, glass 62 may have a hole that accommodates button 19 (FIG. 1). Glass 62 may also have a hole that forms receiver port 23 (FIG. 1) to accommodate sound from a speaker.

At tilt assembly end 100, frame 68 may have one or more protrusions such as protrusion 136. These protrusions, which are sometimes referred to as teeth, tabs, or fingers, are used to hold end 100 of the tilt assembly into place within the housing assembly. As shown in FIG. 10, bezel 14 may have recesses such as hole 162 that receive teeth such as tooth 136. Holes such as hole 162 are preferably shallow enough to allow tilt assembly 60 to rotate in direction 120 as shown in FIGS. 7, 8, and 9 without damaging the teeth. Nondestructive rotation may also be facilitated by use of a curved underside portion in the teeth.

Figure 11:
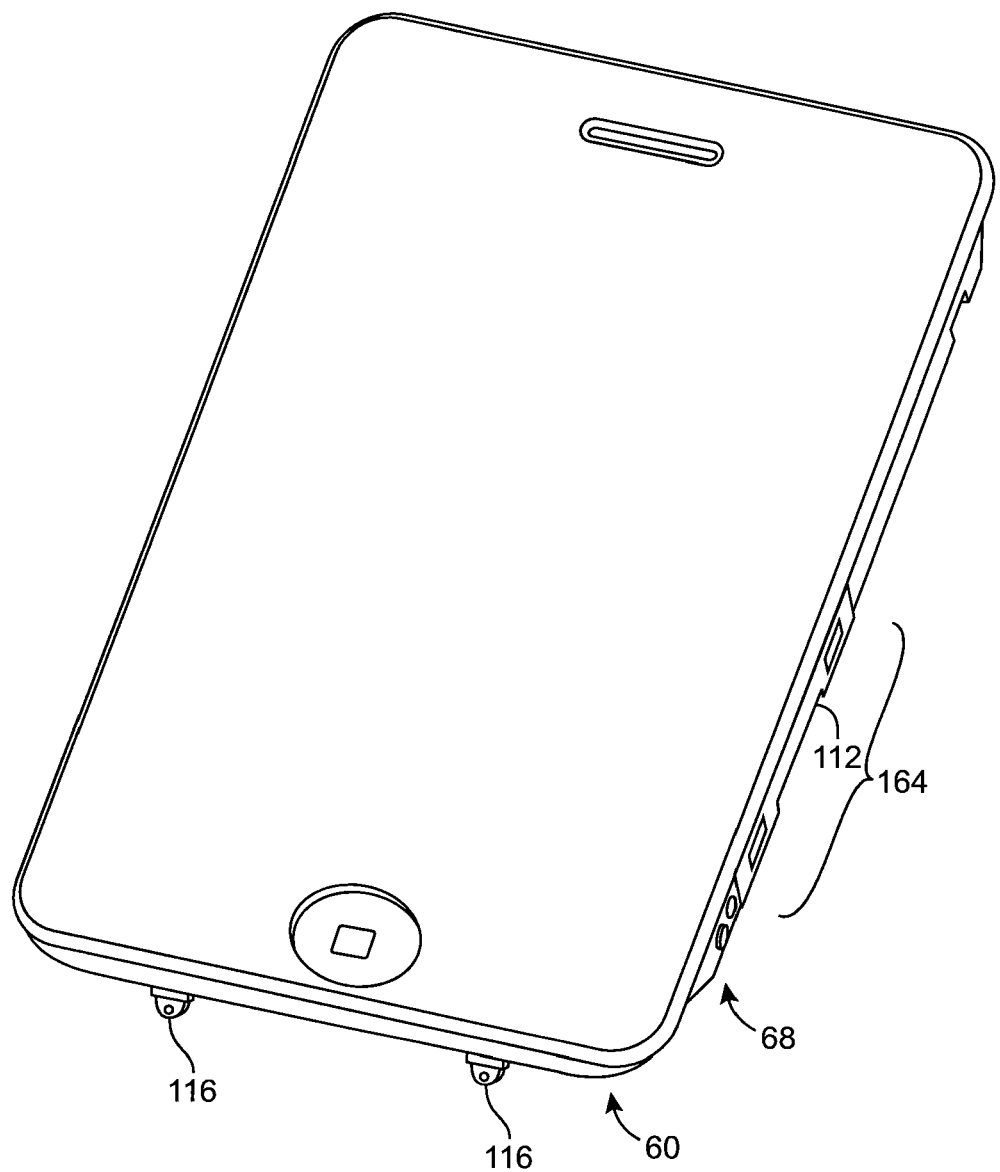
FIG. 11 is a perspective view of an upper device assembly in accordance with an embodiment of the present invention.

A perspective view of tilt assembly 60 is shown in FIG. 11. As shown in FIG. 11, tilt assembly 60 may include frame 68. Metal clips such as clip 112 may be mounted onto the frame (e.g., along length 164, as shown in FIG. 11).

Figure 12:
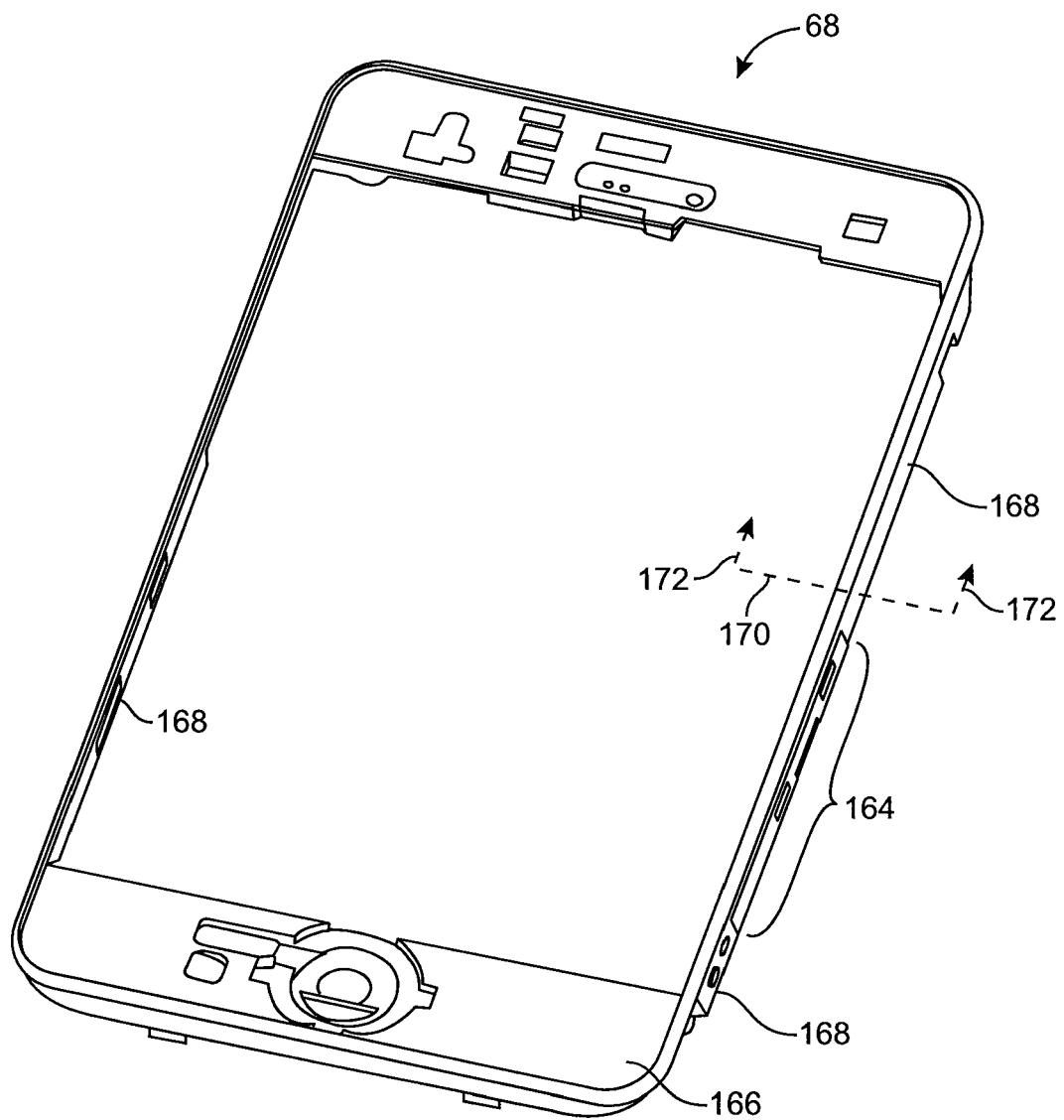
FIG. 12 is a perspective view of a frame that may be used in forming an upper device assembly in accordance with an embodiment of the present invention.

Frame 68 may be formed of a single material (e.g., plastic or metal) or, more preferably, multiple materials. In embodiments in which frame 68 is formed from multiple materials, the weight of frame 68 may be minimized while providing sufficient structural strength where most beneficial. As shown in FIG. 12, for example, frame 68 may have a main portion formed from a molded plastic frame member 166. One or more metal members may be attached to member 166. For example, metal frame struts 168 may be attached to member 166. Any suitable attachment mechanism may be used to connect frame struts 168 to frame member 166. With one particularly suitable arrangement, plastic frame member 166 molded onto metal frame struts 168 during manufacturing. This forms an integral frame 68 having both metal and plastic parts. Additional metal parts such as clips 112 may be attached to frame struts 168. For example, clips 112 may be welded to frame struts 168 or may be attached to frame struts 168 using fasteners or adhesive. Clips 112 may be attached to struts 168 in regions such as region 164 (as an example).

Figure 13:
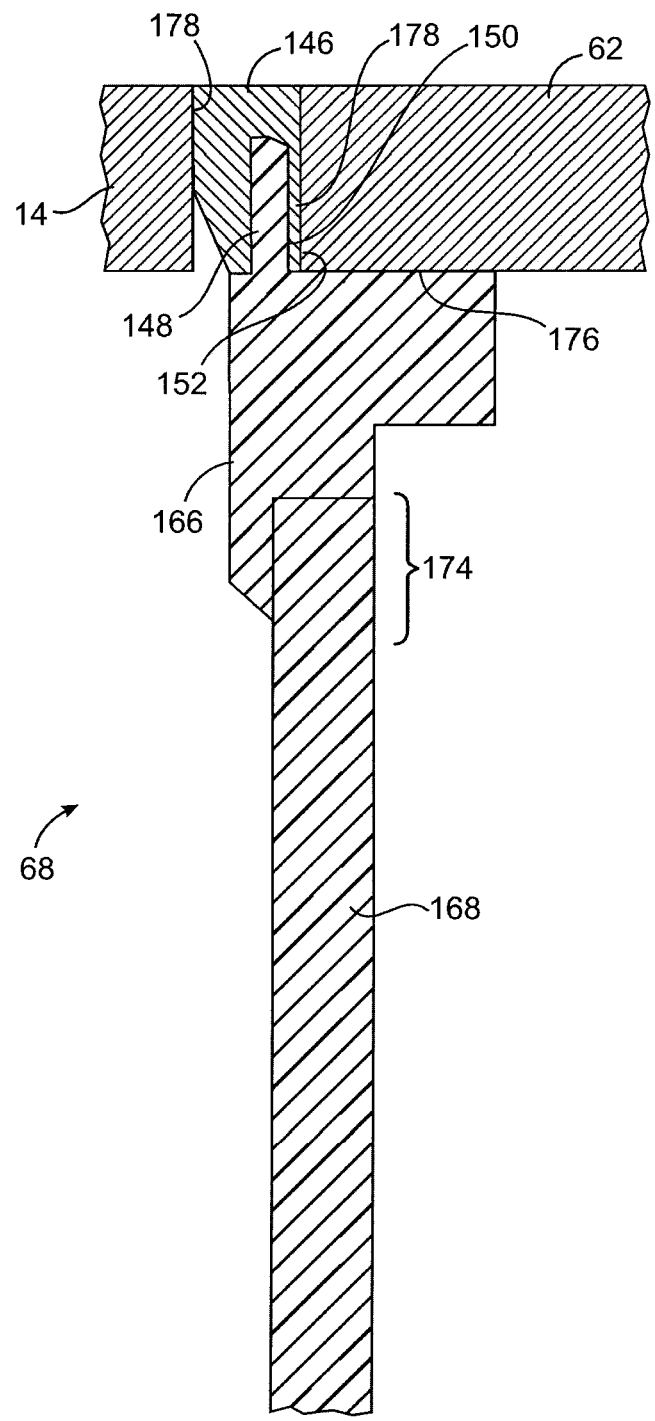
FIG. 13 is a cross-sectional view of a portion of a frame showing how a gasket may be mounted to the frame to separate a bezel from a display in accordance with an embodiment of the present invention.

FIG. 13 shows a cross-sectional side view of frame 68 taken along dotted line 170 and viewed in direction 172 of FIG. 12. As shown in FIG. 13, frame struts 168 may be connected to plastic frame member 166 to form frame 68. Frame struts 168 may have holes or other interlocking features at periodic locations along their lengths that help the plastic of frame member 166 to securely engage frame struts 168 (e.g., in engagement region 174).

Plastic frame member 166 may form a shelf that supports cover glass 62. The shelf may be formed by inner surface 150 of frame member protrusion 148 and upper peripheral frame member surface 176. An advantage of using a shelf that is formed of relatively soft materials is that this helps prevent the shelf from damaging cover glass 62. If desired, portions of gasket 146 such as gasket portion 178 of FIG. 13 may be interposed between edge 152 of cover glass 62 and shelf edge 150. This type of arrangement may provide additional cushioning and may therefore further help to prevent damage to cover glass 62. Gasket 146 may bear against bezel 14 along surface 178, which helps to prevent cover glass 62 from directly touching bezel 14.

Figure 14:
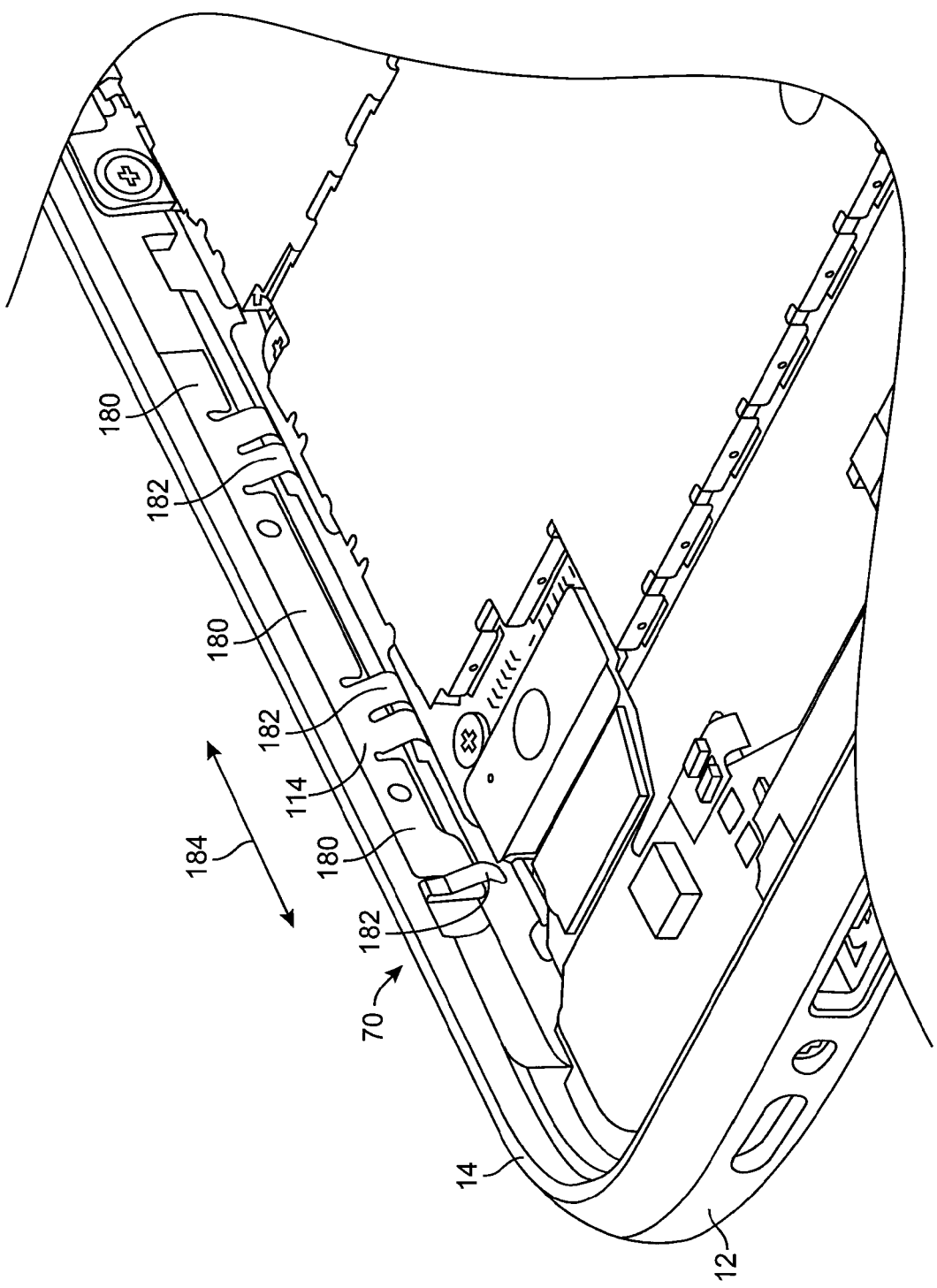
FIG. 14 is a perspective view of a portion of a lower device housing assembly in accordance with an embodiment of the present invention.

A perspective view of an interior portion of housing assembly 70 is shown in FIG. 14. As shown in FIG. 14, bezel 14 may be mounted to plastic housing portion 12. Spring 114 may be mounted to housing assembly 70 by welding spring 114 to bezel 14 or by otherwise attaching spring 114 securely (e.g., using fasteners, adhesive, etc.). An advantage of using springs and a bezel that are formed of metal is that this allows secure attachment mechanisms such as welds to be used to attach the springs. Satisfactory welds may be facilitated by using metals that do not have disparate properties. As an example, springs 114 may be formed from the same material or substantially the same material as bezel 14.

If, for example, bezel 14 is formed from stainless steel, springs 114 may also be formed from stainless steel. The same principle applies to clips 112 and frame struts 168. The use of the same material for clips 112 and struts 168 (e.g., stainless steel) may allow clips 112 to be satisfactorily welded to struts 168. An example of a stainless steel that may provide suitable strength for use in components such as frame struts 168 and bezel 14 is 304 stainless (e.g., ¾ hard 304 stainless). In this type of situation, it may be desirable to form clips 112 and springs 114 from 304 stainless, so that clips 112 may be readily welded to frame struts 168 and so that springs 114 may be readily welded to bezel 14. The use of ¾ hard heat-treated stainless steel allows these parts to be relatively strong while being bendable when sufficiently thin. In an illustrative configuration, frame struts 168 may be about 0.4 mm thick and clips 112 and springs 114 may be about 0.2 mm thick (as an example).

Springs such as spring 114 of FIG. 14 may be formed from elongated spring members such as spring member 180. Spring member 180 may be cut and bent to form spring prongs 182 (also sometimes referred to as spring members or springs). Spring prongs 182 may have any suitable shape. An advantage of forming spring prongs with relatively narrow widths (as measured along longitudinal housing dimension 184) is that this allows the springs to flex during assembly. There may be any suitable number of spring prongs in device 10. As an example, there may be one, two, three, four, five, or more than five spring prongs on the left and on the right sides of device 10. If desired, springs may be mounted on other portions of housing 12 (e.g., on the edge of housing 12 that lies along end 106 (FIG. 7). An advantage of using springs and clips along the sides of device 10 is that this helps to ensure that cover glass 62 lies flush with the upper surfaces of bezel 14, giving device 10 an attractive finished appearance.

Figure 15:
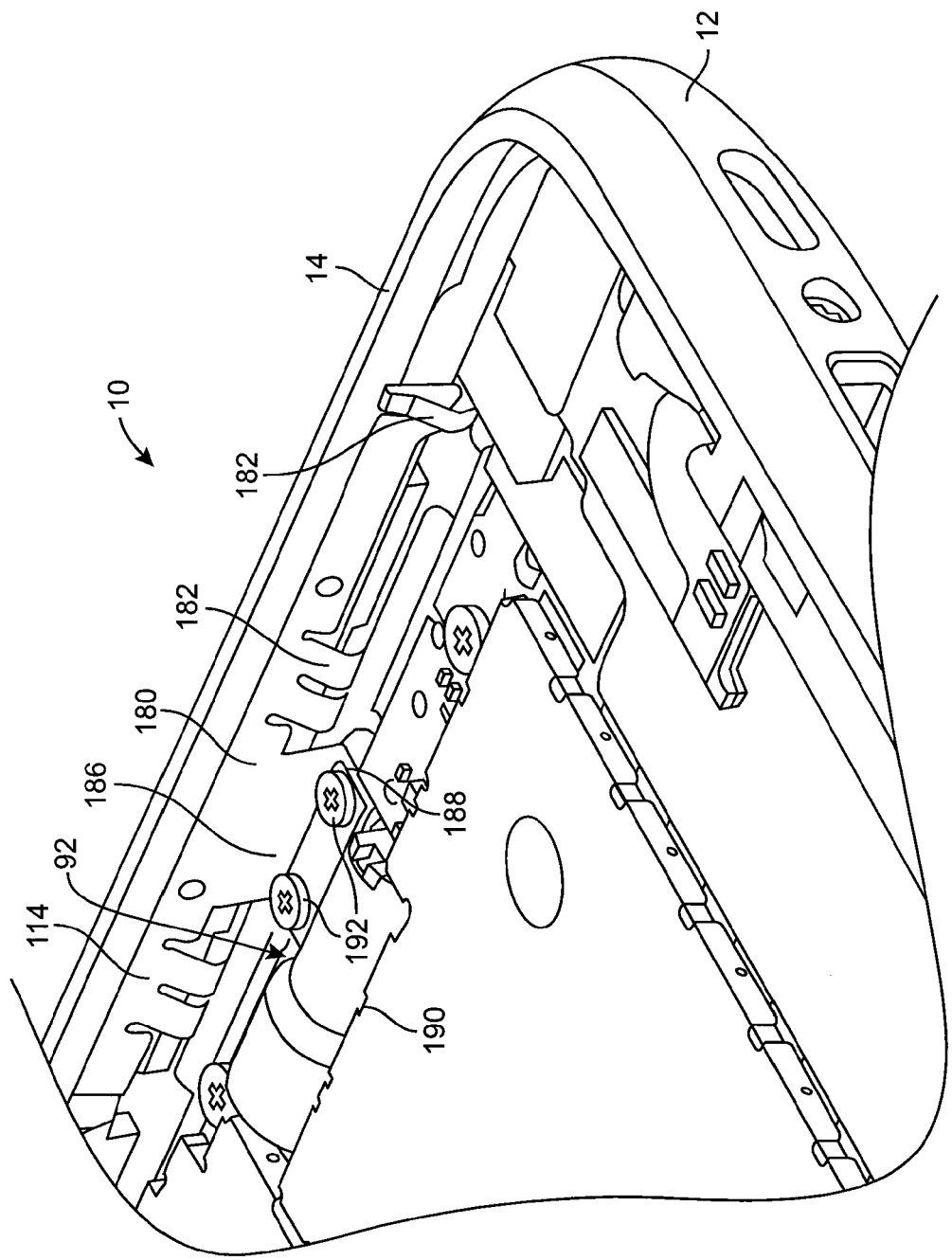
FIG. 15 is a perspective view of another portion of a lower device housing assembly in accordance with an embodiment of the present invention.

If desired, springs 114 (i.e., spring members such as spring member 180) may be used to form a support structure to which components in device 10 may be mounted. An arrangement of this type is shown in FIG. 15. As shown in FIG. 15, spring member 180 may have portions that form a bracket 186. Vibrator 92 (or other suitable components) may be attached to spring member 180 using bracket 186. In particular, screws 192 may be used to connect vibrator mounting bracket 190 to bent tip portion 188 of bracket 186 to hold vibrator 92 in place. An advantage of mounting moving components such as vibrator 92 to a metal structure such as spring member 180 is that this enhances the robustness of device 10 and makes device 10 less prone to failure.

Figure 16:
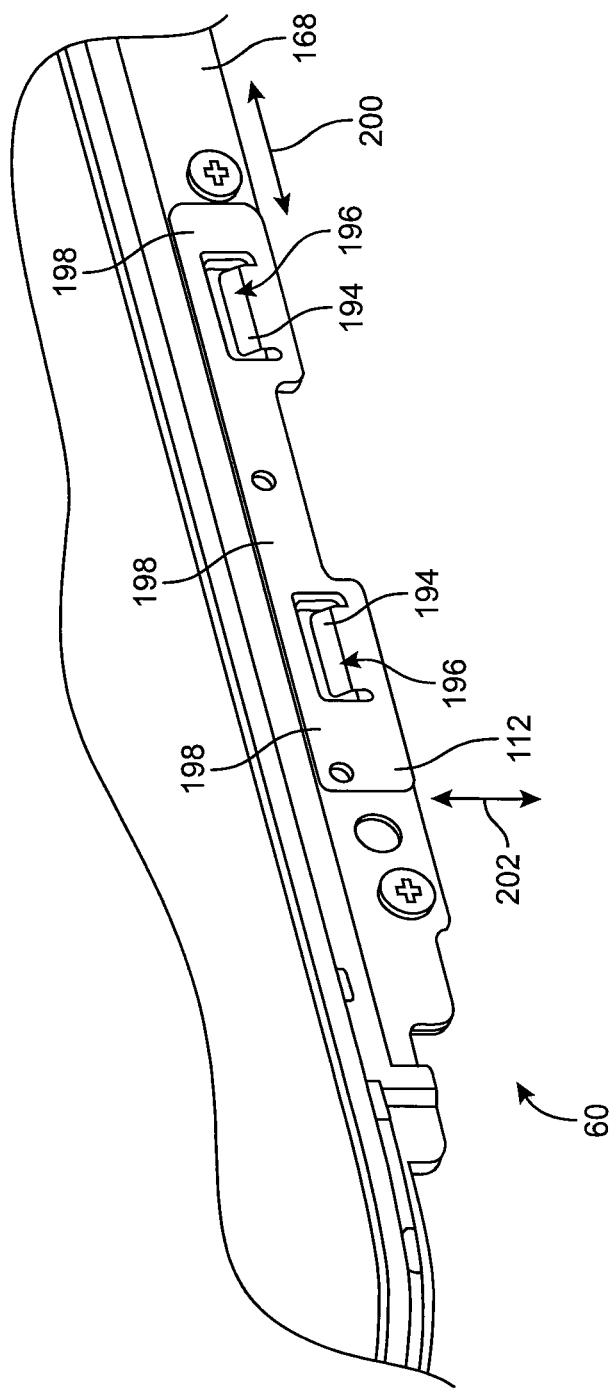
FIG. 16 is a perspective view of a portion of an upper device housing assembly in accordance with an embodiment of the present invention.

Spring prongs 182 may flex during assembly. Following assembly, some or all of spring prongs 182 may engage clips 112 on tilt assembly 60. As shown in FIG. 16, each clip 112 may have a main elongated member 198. Elongated members such as elongated member 198 may be welded to frame struts 168 and may extend along the edge of tilt assembly 60 parallel to longitudinal dimension 200. Elongated member 198 may be substantially planar (as an example) and may have a planar surface aligned with longitudinal dimension 200 and vertical dimension 202. Portions 194 of elongated member 198 may be bent with respect to vertical dimension 202 and with respect to the planar surface defined by dimensions 202 and 200. Bending portions 194 inwardly away from the plane of elongated member 198 angles portions 194 inwardly so that bent portions 194 are angled with respect to vertical dimension 202. This forms holes 196 that can receive protruding spring prongs 182 (FIGS. 14 and 15) when tilt assembly 60 and housing assembly 70 are connected to each other. Holes may also be formed by removing portions of elongated member 198, by bending or otherwise manipulating portions of member 198 sideways or in other directions, by bending multiple portions of member 198 within each hole, etc. The arrangement of FIG. 16 in which holes 196 have been formed by bending portions 194 down and inwards is merely illustrative.

Figure 17:
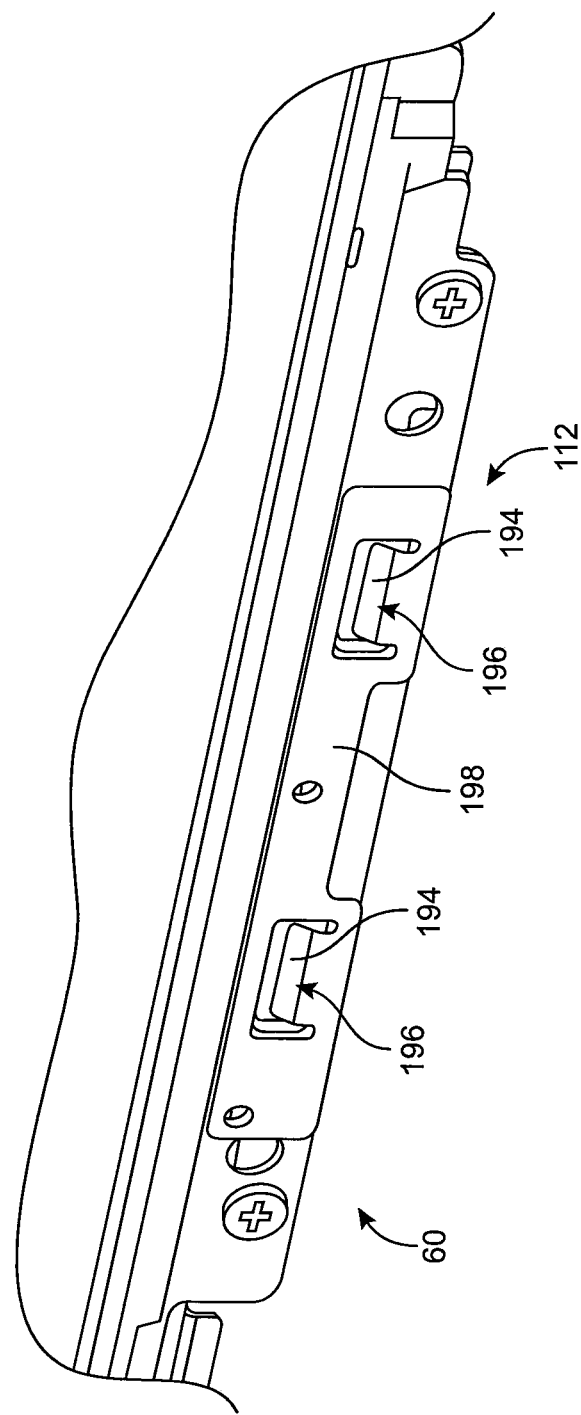
FIG. 17 is a perspective view of another portion of an upper device housing assembly in accordance with an embodiment of the present invention.

With one suitable embodiment of tilt assembly 60, there is a member such as member 198 that forms a clip on each side of tilt assembly 60. The perspective view of FIG. 16 shows an illustrative clip 112 that has been formed on the right side of tilt assembly 60. The perspective view of FIG. 17 shows an illustrative clip 112 that has been formed on the left side of tilt assembly 60.

Figure 18:
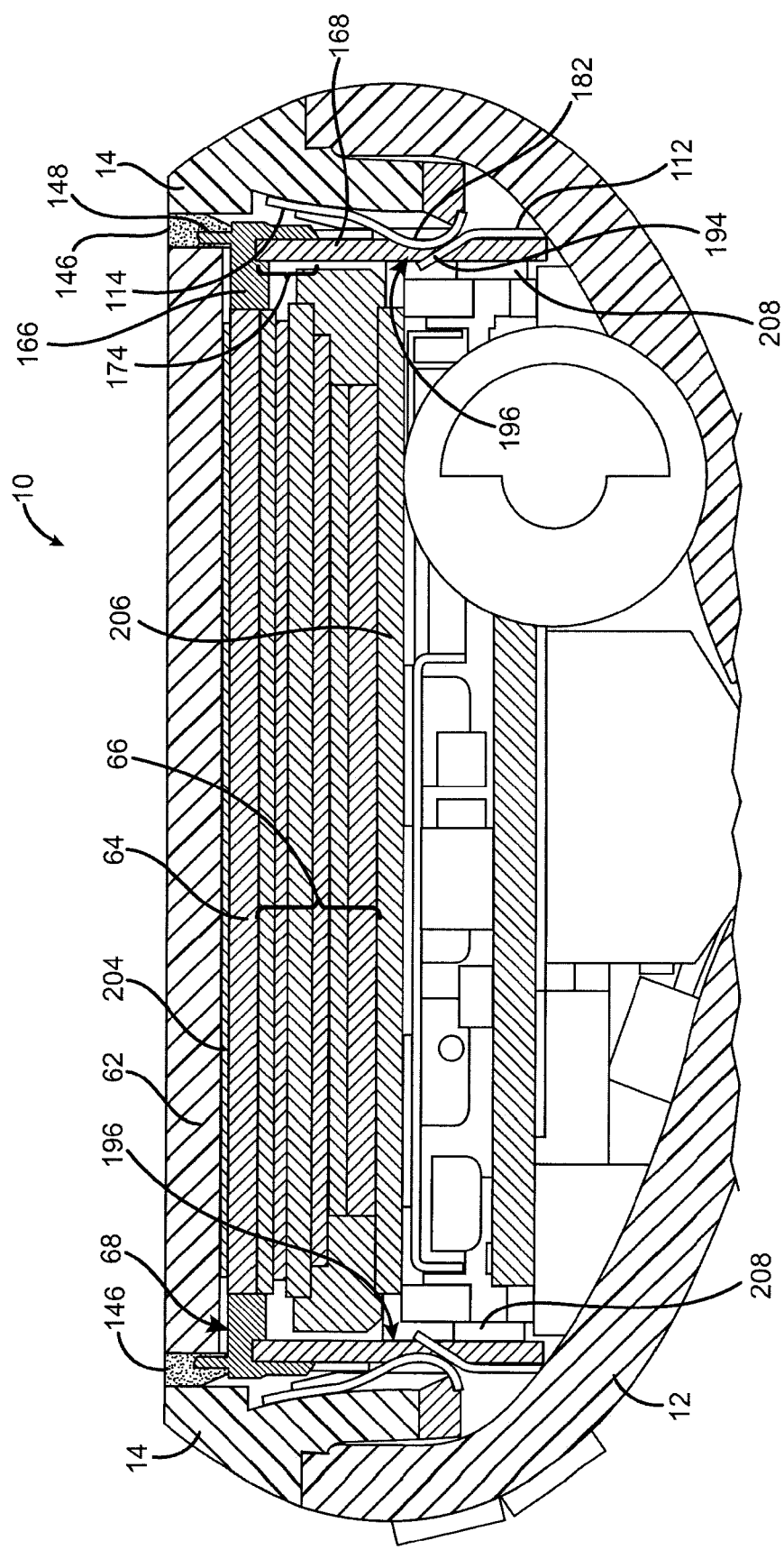
FIG. 18 is a cross-sectional end view of a portable electronic device in accordance with an embodiment of the present invention showing how springs may be used to hold an upper device assembly and lower device assembly together.

A lateral cross-sectional view of an illustrative device 10 is shown in FIG. 18. As shown in FIG. 18, cover glass 62 may be mounted on top of device 10. An adhesive layer such as adhesive layer 204 may be formed between cover glass layer 62 and touch sensor 64. Touch sensor 64 may be, for example, a capacitive multitouch sensor (as an example). Touch sensor 64 may be mounted above a display unit such as liquid crystal display unit 66. Display unit 66 may be mounted above frame member 206. Frame member 206, which is sometimes referred to as a "mid-plate member" may be formed of a strong material such as metal (e.g., 304 stainless steel). Frame member 206 may have vertical portions 208. Vertical portions 208 may be attached to frame struts 168 by screws, other suitable fasteners, welds, adhesive, etc. Frame member 206 helps form a rigid platform for the components (such as display unit 66, sensor 64, and cover glass 62) that are associated with the tilt assembly. In addition to providing structural support, mid-plate frame member 206 may also provide electrical grounding (e.g., for integrated circuits, printed circuit board structures, for antennas in wireless devices 44, etc.).

As described in connection with FIG. 13, frame struts 168 may be attached to frame member 166 of frame 68. For example, frame member 166 may be formed from plastic that is molded over frame struts 168 and that engages frame struts 168 in engagement region 174. Frame protrusion 148 and gasket 146 may be used to separate glass 62 from bezel 14.

Springs 114 may be welded or otherwise mounted to bezel 14. When the tilt assembly is mounted in the housing assembly as shown in FIG. 18, spring prongs 182 protrude into the holes such as holes 196 that are formed by bent portions 194 in clips 112.

Figure 19:
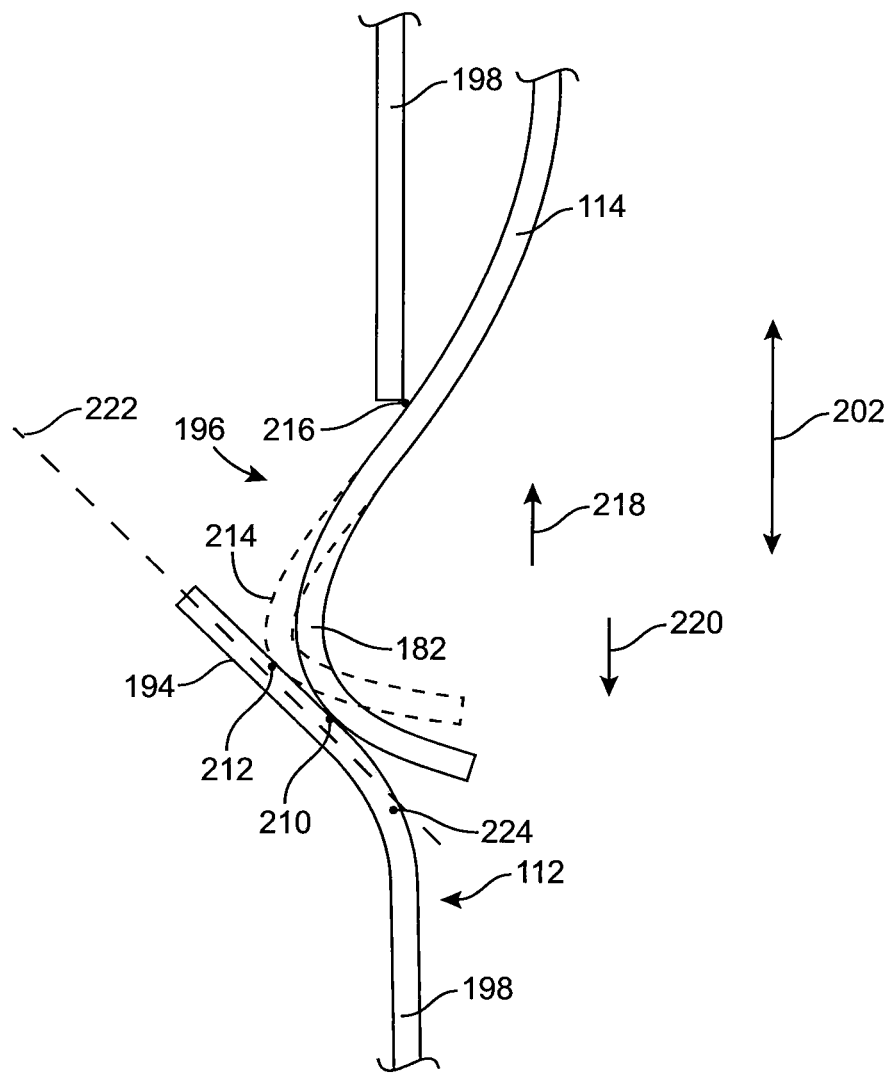
FIG. 19 is a cross-sectional view of an illustrative spring and matching clip that may be used to attach upper and lower housing portions together in accordance with an embodiment of the present invention.

A cross-sectional view of spring 114 and clip 112 is shown in FIG. 19. As shown in the cross-sectional view of FIG. 19, angled portion 194 of clip 112 forms a rigid substantially planar shelf-like member that biases the tip of spring prong 182 upwards at lower biasing point 210. Spring prong 182 is also engaged by member 198 of clip 112 at upper biasing point 216. Biasing point 210 retards movement of spring 114 and housing assembly 70 in downward direction 220 relative to tilt assembly 60. Biasing point 216 retards movement of spring 114 and housing assembly 70 in upward direction 218 relative to tilt assembly 60. Planar member 194 is oriented along axis 222 and is angled with respect to vertical dimension 202. If desired, member 194 may flex somewhat along its length and may pivot somewhat about point 224.

The flexibility of spring prongs 182, the optional flexibility of planar member 194, and the angled orientation of planar member 194 makes the engagement arrangement formed by springs 114 and clips 112 tolerant to manufacturing deviations. For example, consider the situation in which manufacturing deviations cause spring prong 182 to be positioned where indicated by dashed outline 214 in FIG. 19. This type of position might result, for example, from a weld location misalignment in spring 114 or in clip 112 (or both) or a deviation in the desired bend angle for member 194 or prong 182. As a result of such misalignment, spring prong 182 presses against biasing member 194 at biasing point 212 instead of at biasing point 210. Despite this deviation in the biasing point location from its nominal position, there will still be good engagement between spring prong 182 and clip member 198. For example, although the lower biasing point is altered (from point 210 to point 212), upper biasing point 216 will still generally bias clip 114 in downwards direction 220 toward its desired location. The angled orientation of member 194 and the curved shape of spring prong 182 therefore helps to accommodate manufacturing variations. The smoothly curved shape of spring prongs 182 may also help to prevent the insertion and removal process from being too harsh when engaging and disengaging the tilt and housing assemblies from each other.

Figure 20:
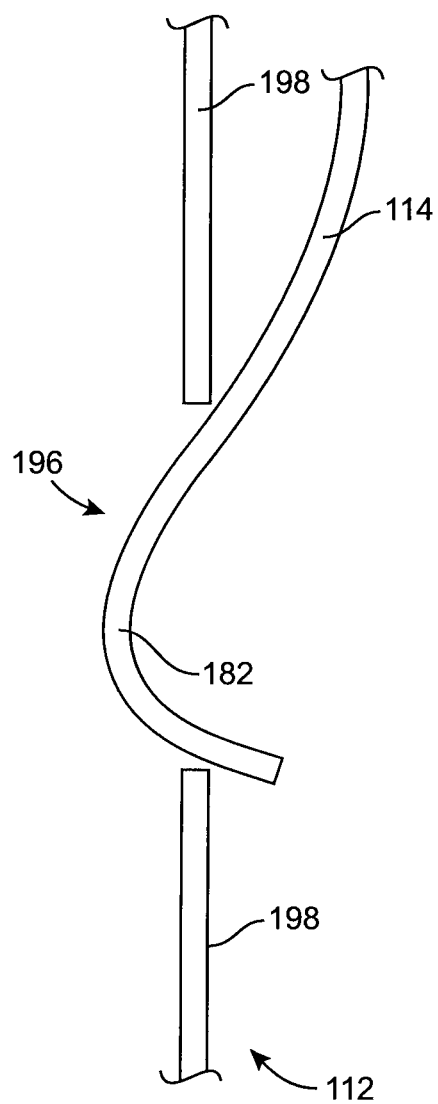
FIG. 20 is a cross-sectional view of another illustrative spring and matching clip that may be used to attach upper and lower housing portions together in accordance with an embodiment of the present invention.

If desired, alternative spring and clip arrangements may be used. An example of an alternative spring and clip configuration is shown in FIG. 20. As shown in FIG. 20, it is not necessary to form a bent member in clip 112. Rather, spring prongs such as spring prong 182 of FIG. 20 may be accommodated in a hole 196 that has been formed by removing a region of metal (or other suitable material) from within elongated member 198 of clip 112.

Figure 21:
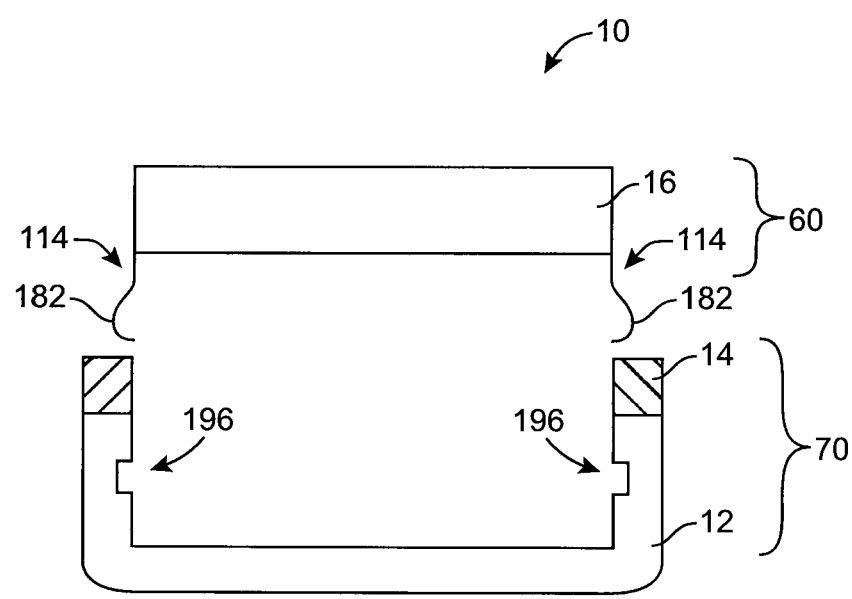
FIG. 21 is a cross-sectional view of an illustrative spring and matching clip arrangement for securing housing portions together in a portable electronic device arrangement in which the springs are attached to an upper housing assembly in accordance with an embodiment of the present invention.

As shown in FIG. 21, it is not necessary to form holes 196 in metal clips such as clips 112. In the FIG. 21 example, holes 196 have been formed from recesses in housing 12.

Moreover, as the example of FIG. 21 demonstrates, it is not necessary to form clips 112 on tilt assembly 60 and springs 114 on housing assembly 70. If desired, springs 114 and spring prongs 182 may be attached to tilt assembly 60 and holes 196 (whether integral to housing 12 or whether formed from clips 112) may be formed as part of housing assembly 70. An advantage of forming springs 114 on housing assembly 70 (e.g., as shown in FIG. 14) is that this reduces the likelihood that springs 114 might scratch bezel 14 during insertion of tilt assembly 60 into housing assembly 70.

Figure 22:
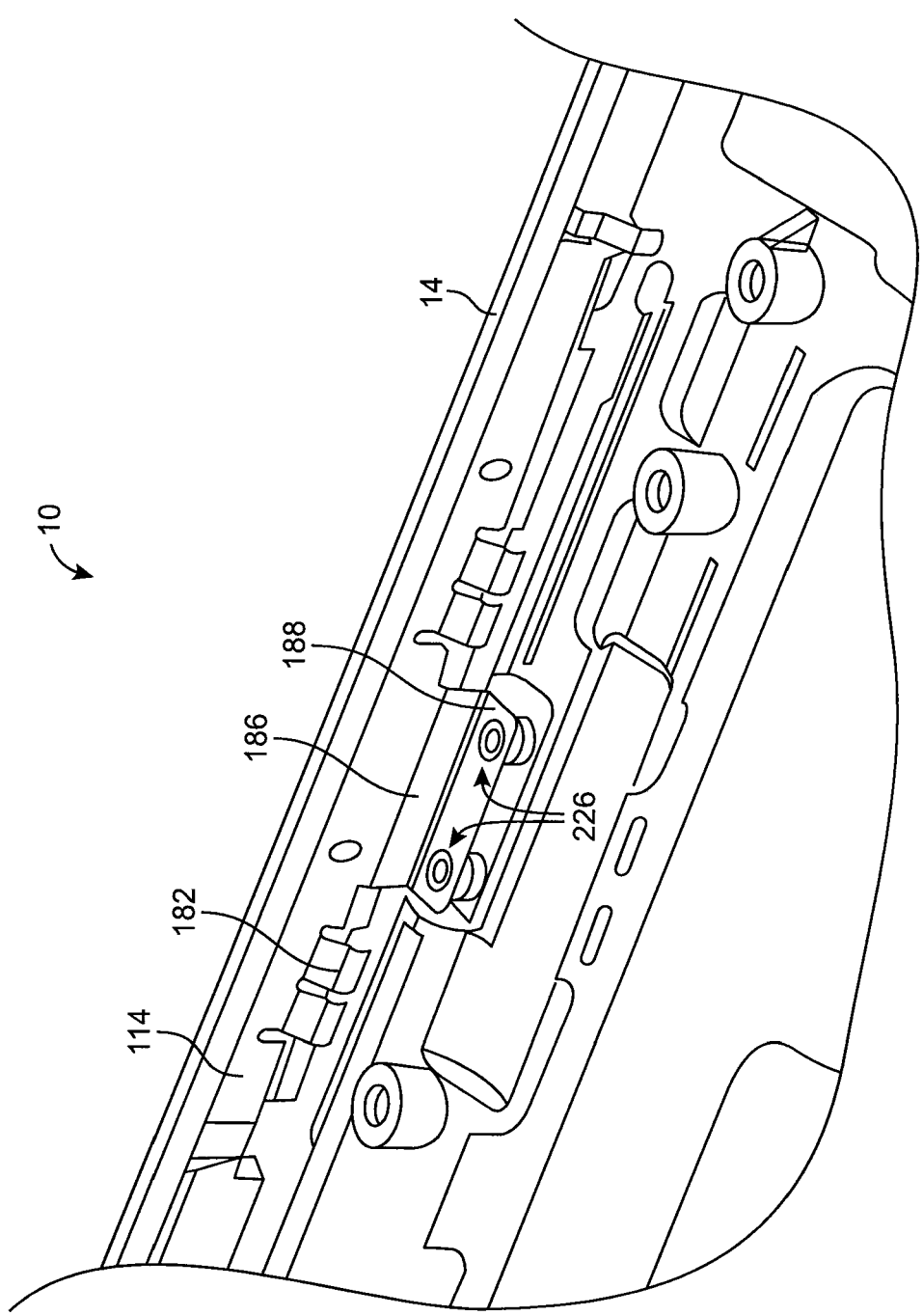
FIG. 22 is a perspective view of an interior portion of a portable device housing showing how springs may be used to form a mounting region for an electronic component in accordance with an embodiment of the present invention.

As described in connection with FIG. 15, because springs 114 are attached to bezel 14 and thereby housing 12, springs 114 may be used to form a mounting structure for components such as vibrator 92. In particular, a spring such as spring 114 of FIG. 22 may be configured to form a mounting bracket 186 having a horizontal planar member 188. During component mounting operations, fasteners such as screws 192 of FIG. 15 may be inserted into holes 226 (FIG. 22).

When assembling device 10, it is generally necessary to make electrical connections between components such as the components on tilt assembly 60 and housing assembly 70. For example, electrical connections may be made between the circuitry associated with the printed circuit board structures of housing assembly 70 and the display unit and sensor in display 16. Electrical connections may also be made between the printed circuit board circuitry and components such as the receiver speaker of port 23, microphone 76, speaker 78, and a proximity sensor (e.g., a sensor that detects the presence of a human body in close proximity to device 10). Such electrical connections may be made using a flexible circuit structure formed from a pattern of conductive traces on a flexible printed circuit substrate such as a polyimide-based substrate (sometimes referred to as a "flex circuit"). Electrical connections should generally also be made for buttons such as volume up and down buttons, ringer on/off buttons, hold buttons, etc. Antennas in regions 18 and 21 may also be electrically connected to circuitry on the printed circuit board structures of housing assembly 70.

Different electrical connections use different types of electrical connectors. For example, radio-frequency signals that are conveyed to and from the antennas in device 10 may be carried over transmission lines such as coaxial cable transmission lines (i.e., micro-coax). Connections in this type of radio-frequency transmission line path may therefore involve micro-coax connectors. As another example, when two printed circuit boards are joined, it may be desirable to use so-called board-to-board connectors. Flex circuits can be connected using connectors such as zero-insertion-force (ZIF) connectors. Still other connectors may be used in other contexts.

The need to make numerous electrical connections of one or more types may make assembly challenging for unskilled workers. Device 10 may therefore use a numbering system in which the connections that are to be made are numbered. The numbering system that is used may, for example, number the connections that are to be made in a preferred or required order of assembly. Instructions may be included in the interior of the device. For example, instructions may be laser-etched into a metal surface such as an electromagnetic shielding "can" that covers one or more integrated circuits on the printed circuit board structures of housing assembly 70.

Figure 23:
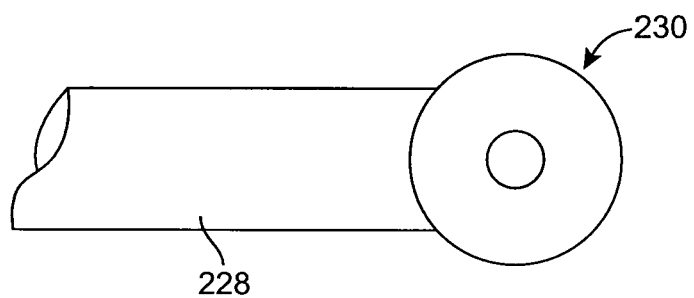
FIG. 23 is a top view of an illustrative coaxial cable connector in accordance with an embodiment of the present invention.

A top view of an illustrative coaxial cable connector is shown in FIG. 23. As shown in FIG. 23, coaxial cable 228 may be attached to coaxial cable connector 230. Coaxial cable connector 230 may be connected to another coaxial cable, a printed circuit board, a flex circuit, an antenna, combinations of such structures, or any other suitable electrical structure.

Figure 24:
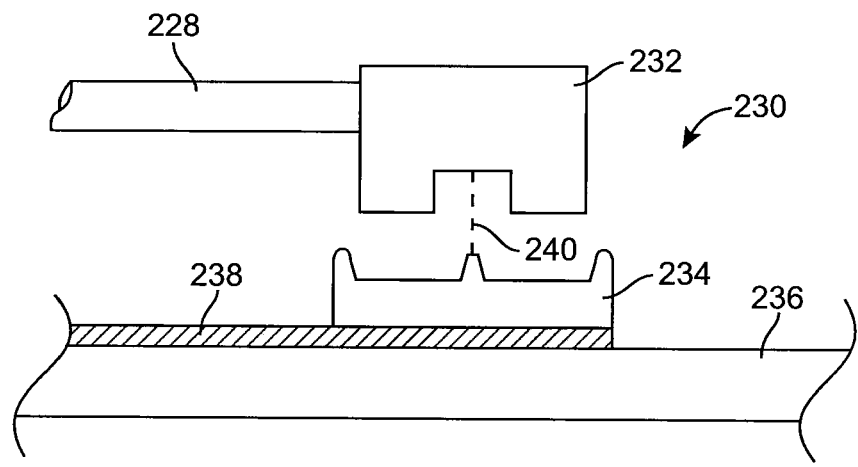
FIG. 24 is a side view of an illustrative coaxial cable connector in accordance with an embodiment of the present invention.

FIG. 24 is a side view of an illustrative coaxial cable connector of the type shown in FIG. 23. In the example of FIG. 24, coaxial connector 230 is shown in a disconnected state. Upper portion 232 of connector 230 is connected to coaxial cable 228. Lower portion 234 of connector 230 is mounted to electrical structures 236 such as a flex circuit, printed circuit board, etc. Traces within structure 236 such as traces 238 may be used to electrically connect lower connector half 234 of coaxial cable connector 230 to circuitry within device 10 (e.g., an antenna, a transceiver, etc.). Connector portions 232 and 234 may be interconnected during assembly as indicated schematically by dotted line 240.

Figure 25:
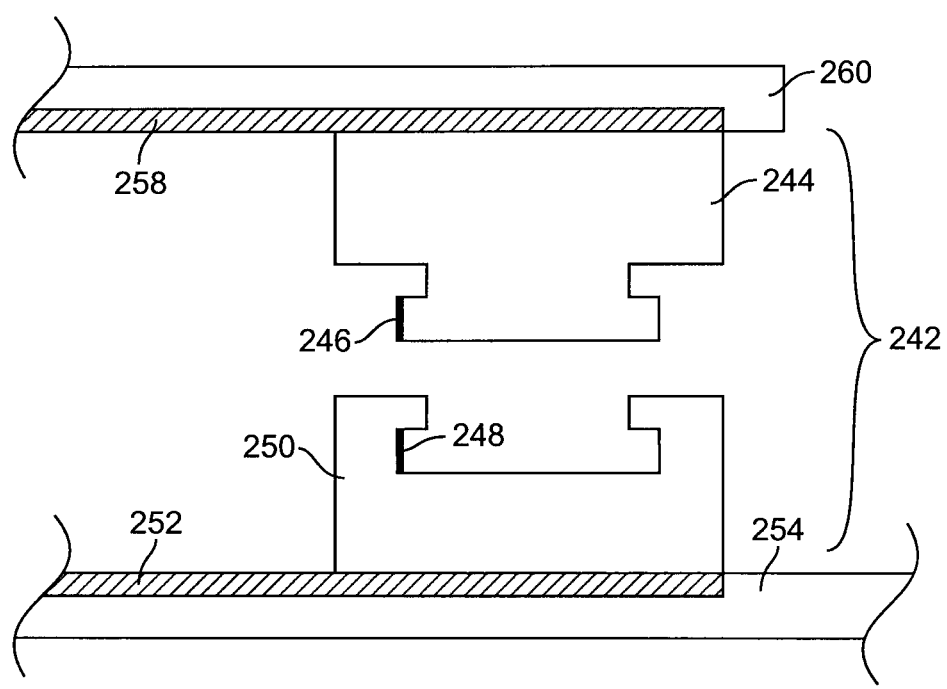
FIG. 25 is a side view of an illustrative board-to-board connector in accordance with an embodiment of the present invention.
Figure 26:
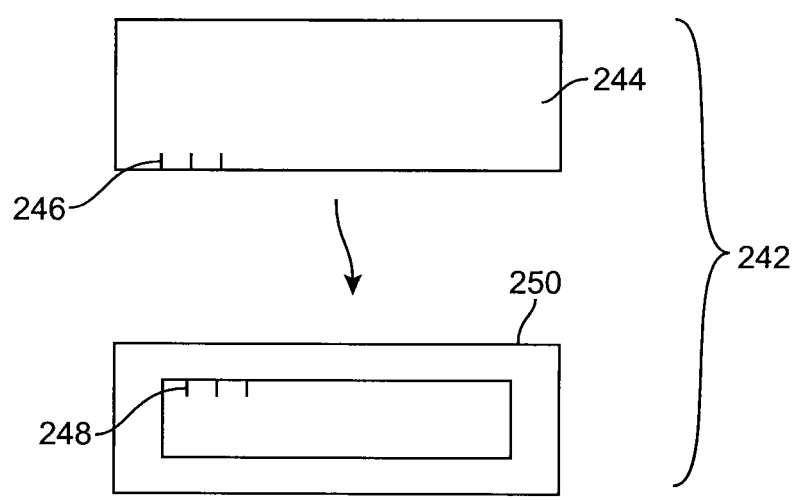
FIG. 26 is a top view of an illustrative board-to-board connector in accordance with an embodiment of the present invention.

An example of a board-to-board connector is presented in connection with FIGS. 25 and 26. As shown in FIG. 25, board-to-board connector 242 may include an upper-half connector portion 244 and a lower-half connector portion 250. Both the upper and lower portions of connector 242 may have numerous pins such as pins 246 on connector portion 244 and pin 248 on connector portion 250. In the FIG. 25 example, connector 242 is disassembled, because male connector part 244 has not yet been connected to female connector part 250. During assembly, this connection is made to interconnect electrical structures to which connector parts 244 and 250 are mounted. As shown in the FIG. 25 example, connector part 244 may be electrically connected to traces 258 in electrical structure 260 and connector part 250 may be electrically connected to traces 250 in electrical structure 254. Structures 260 and 254 may be printed circuit boards.

A top view of board-to-board connector 242, which presents an illustrative layout for pins such as pints 246 and 248 is shown in FIG. 26.

Board-to-board connectors such as connector 242 of FIGS. 25 and 26 may be used whenever it is desired to electrically interconnect structures such as printed circuit boards (e.g., when they are mounted on top of each other). Because there are typically numerous pins in a board-to-board connector such as a printed circuit board, the use of a board-to-board connector may be preferable to using wires or cables to make a connection. Moreover, unlike hardwired solder connectors, board-to-board connectors may be readily disconnected when desired for rework or repair.

Flex circuits may be used to form connections between different parts of device 10. Flex circuits have advantages over conventional parallel bus wires such as reduced size and weight. Flex circuits may also be less expensive to manufacture in large quantities than other types of interconnects and provide geometric flexibility when designing and assembly complex structures. In a typical arrangement, a flex circuit might be attached at one end to a series of components (e.g., dock connector 20, acoustic components, sensors, etc.). At the other end, the flex circuit may need to be connected to circuitry on a printed circuit board. This type of connection may be formed using a socket-type connector that is configured to receive a flex circuit (sometimes referred to as a zero-insertion-force or ZIF connector).

Figure 27:
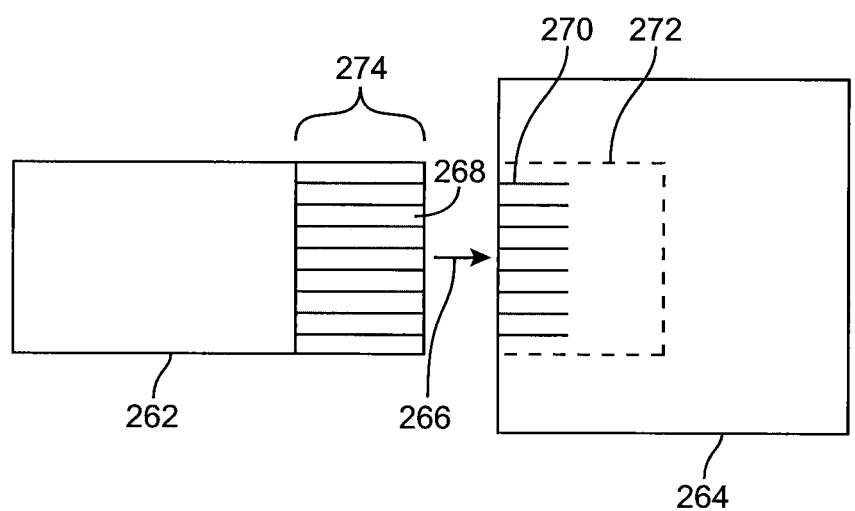
FIG. 27 is a top view of an illustrative zero-insertion-force connector for forming a connection with a flex circuit communications path in accordance with an embodiment of the present invention.
Figure 28:
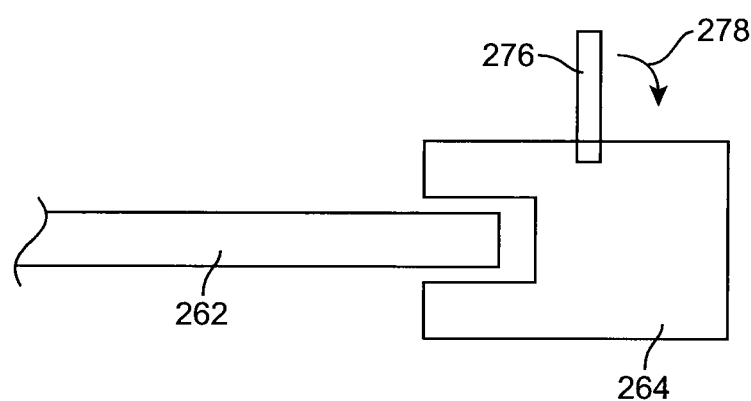
FIG. 28 is a side view of an illustrative zero-insertion-force connector for forming a connection with a flex circuit communications path in accordance with an embodiment of the present invention.

A top view of an illustrative flex circuit 262 and zero-insertion force flex circuit connector 264 is shown in FIG. 27. During assembly, flex circuit 262 is inserted into connector 264 in direction 266. This causes exposed traces 268 in region 274 to electrically connect with mating conductors 270 in region 272 of connector 264. As shown in the side view of FIG. 28, connector 264 may have a lever 276 that may be actuated by pressing downwards in direction 278. When lever 276 is pressed downwards in this way, the pins of connector 264 engage the flex circuit traces of flex circuit 262 and form a solid set of electrical connections.

The connector types shown in FIGS. 23-28 are merely illustrative. Device 10 may use one, two, three, or more than three different types of connectors in interconnecting its electrical components. Some or all of these connectors may, if desired, be non-destructive connectors having mating parts that can be disconnected if desired for rework or repair operations. An advantage to using connectors that can be repeatedly connected and disconnected is that this may reduce waste in the event of a rework or repair.

Particularly in assembly environments in which there are numerous connections that need to be made, assembly operations may be challenging for unskilled workers who are unfamiliar with the assembly process. Device 10 may therefore include a set of numbers to help guide workers during the assembly process. An example of this type of arrangement is shown in FIG. 29.

Figure 29:
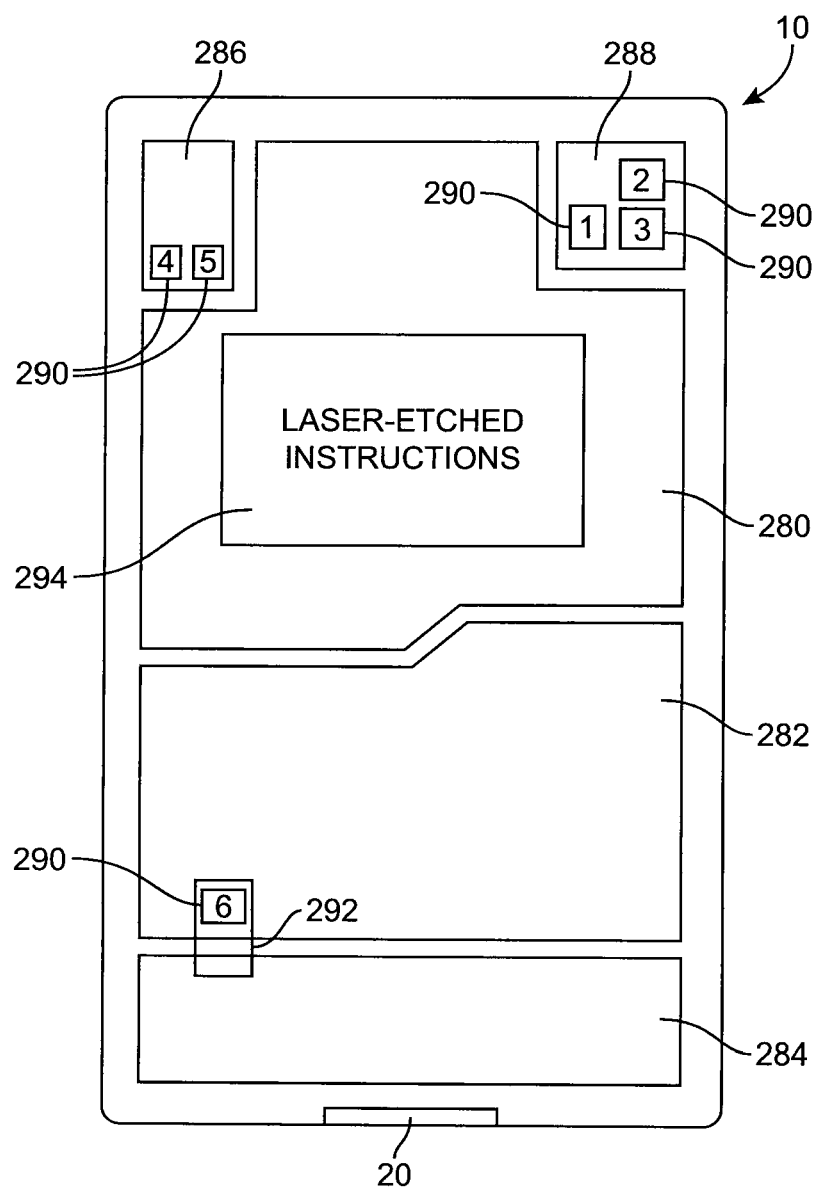
FIG. 29 is a top view of an interior portion of illustrative portable electronic device having numbered connector regions and laser-etched assembly instructions in accordance with an embodiment of the present invention.

FIG. 29 shows an illustrative interior view of device 10. As shown in FIG. 29, device 10 may include components such as integrated circuits encased in electromagnetic shielding ("cans") such as housings 280 and 282. Device 10 may also include one or more modules such as module 284. Module 284 may be, for example, a module that includes acoustic components such as a microphone, speaker, etc. Dock connector 20 may be connected to a module such as module 284.

Regions such as regions 286 and 288 may include exposed circuit boards, one or more discrete components, flex circuits, or other suitable electrical components.

The components of device 10 may be interconnected by communications paths. The communications paths may be, for example, transmission line paths such as coaxial cable paths, flex circuits, board-to-board paths supported by printed circuit board traces, etc., as described in connection with FIGS. 23-28. An illustrative communications path is shown as path 292 in FIG. 29.

As shown in FIG. 29, assembly order indicators such as numbers 290 may be formed on device 10. The assembly order indicators may be provided in the form of any suitable markings that indicate a preferred or required order of assembly for the connectors that are used in interconnecting the electrical components of device 10. Examples of suitable indicators include Arabic numerals (e.g., 1, 2, 3, ...), Roman numerals, Chinese numerals, letters (e.g., A, B, C ... or comparable letters in other alphabets), combinations of numerals and letters (e.g., A1, A2, B1, B2, B3, C1, ...), or symbols (e.g., *, , *, etc.). The indicators preferably denote a desired assembly order or orders and may, if desired, be followed in reverse order by a worker who wishes to partly or fully disassembly a device for rework or repair.

To assist workers in deciphering the assembly/disassembly order indicators and/or to provide other suitable guidance for the workers, device 10 may include instructions such as instructions 294. Instructions 294 may be laser-etched on the metal surface of cans such as can 280, may be printed on can 280 or other suitable surface of the components of device 10, may be printed on a label that is affixed within device 10, may be inscribed on an interior portion of case 12, or may be otherwise formed on device 10. Assembly and disassembly instructions (e.g., instructions referring to the assembly order) may also be included in software and displayed using display 16, although this type of arrangement will generally only be practical if device 10 is at least partly operational).

Instructions 294 may be written instructions that include, for example, explanatory text (e.g., in English, Chinese, or other suitable language). Instructions 294 may also be partly or completely formed from symbolic instructions (e.g., a diagram showing how parts should be connected, a list of corresponding assembly order indicators, etc.). Instructions 294 may, if desired, include information on the proper use of device 10, legal notices, etc.

In addition to or instead of relying on the alignment properties provided by the engagement of springs 182 within holes 196 of clips 112, it may be desirable to form hard stop structures in device 10 that help to vertically align tilt assembly 60 relative to housing assembly 70. With a hard stop arrangement, one or more rigid structures in tilt assembly 60 bear against one or more corresponding rigid structures in housing assembly 70 in an assembled device. When tilt assembly 60 and housing assembly 70 are fully assembled, these respective rigid structures will precisely define the relative vertical position of tilt assembly 60 relative to housing assembly 70. This improves manufacturing tolerances and allows the sizes of parts in device 10 to be minimized, while ensuring proper alignment of structures such as the cover glass and bezel of device 10.

Figure 30:
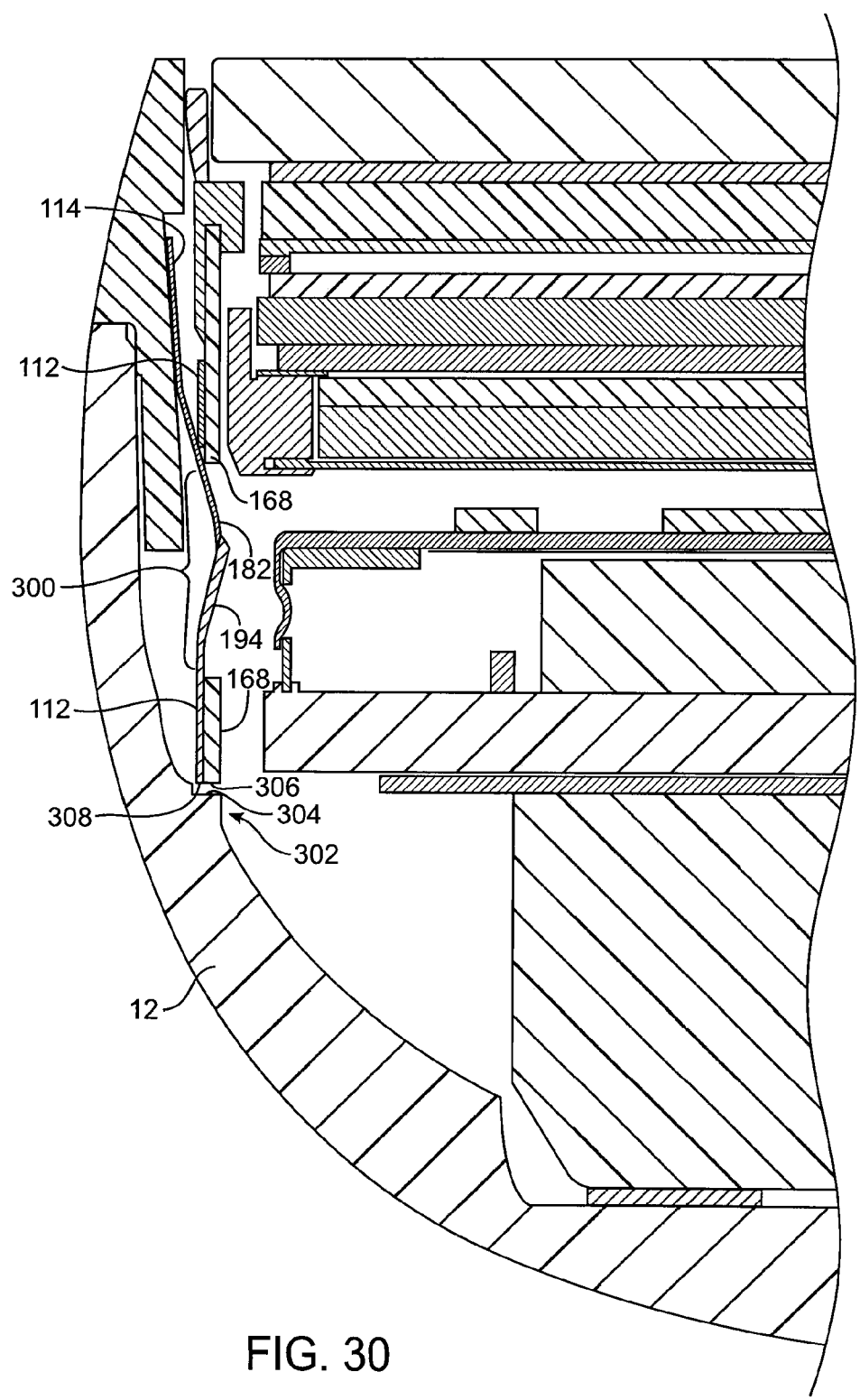
FIG. 30 is a cross-sectional end view of an illustrative portable electronic device showing how a hard stop structure may be used to help define the vertical alignment of an upper device assembly relative to a lower device assembly in accordance with an embodiment of the present invention.

Any suitable configuration may be used to implement a hard stop feature of this type. With one suitable arrangement, which is described herein as an example, the lower portions of frame struts 168 bear against mating protrusions in housing 12. This is shown in FIG. 30. As shown in FIG. 30, frame struts 168 may have holes such as hole 300 that allow spring prongs 182 to protrude into holes 196 of clips 112. Holes 300 may be substantially aligned with holes 196 (FIG. 18).

The lowermost portions of frame struts 168 may have lower surfaces such as surface 306 of FIG. 30. Clip 112 may also have a lower surface (e.g., surface 308).

Housing 12 may be provided with a hard stop structure such as protrusion 302. Protrusion 302 may have an upper surface such as upper surface 304. When tilt assembly 60 and housing assembly 70 are assembled, surfaces 306 and 304 bear directly against each other. This accurately defines the minimum vertical separation between tilt assembly 70 and housing assembly 60.

Although shown as an integral feature formed in the surface of housing 12, lower hard stop structure 302 may be formed using one or more separate structures that are rigidly fastened to housing 12 if desired. The arrangement of FIG. 30 in which protrusion 302 is formed from a portion of the plastic housing 12 is merely illustrative.

Figure 31:
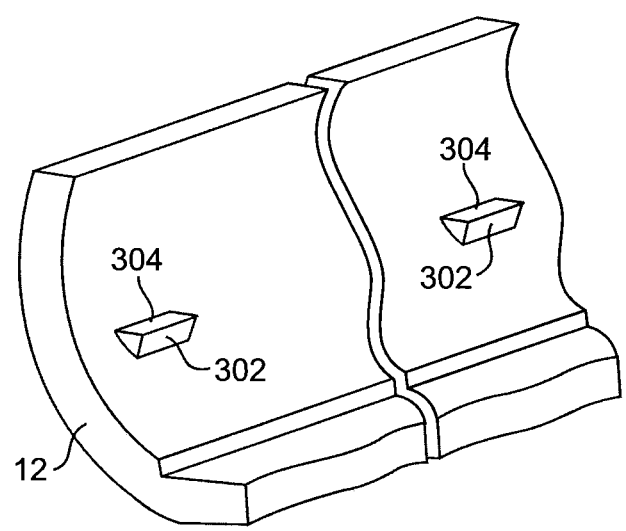
FIG. 31 is a perspective view of a portion of a portable electronic device housing showing illustrative hard stop structures that may be used at each corner of a device housing in accordance with an embodiment of the present invention.
Figure 32:
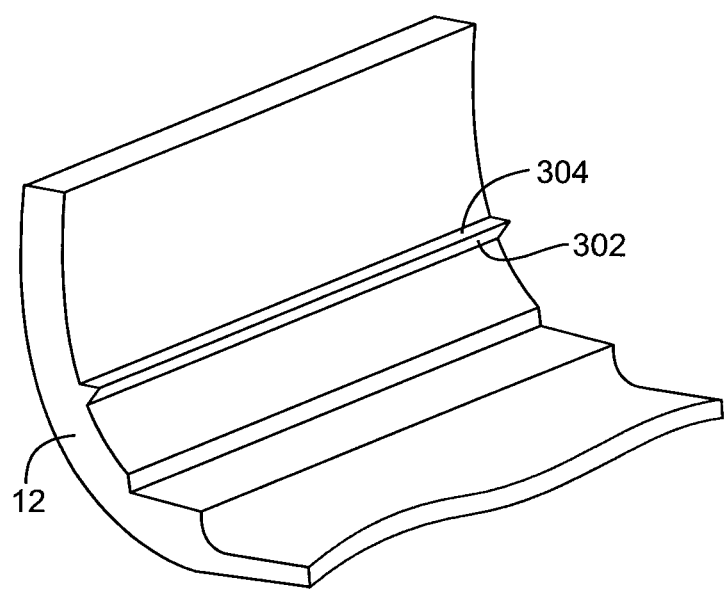
FIG. 32 is a perspective view of a portion of a portable electronic device housing showing illustrative hard stop structures that may be along the edges of the portable electronic device housing in accordance with an embodiment of the present invention.

Hard stop structures such as structures 302 may be provided at each of the four corners of housing assembly 70. With this type of arrangement, which is illustrated in FIG. 31, the amount of volume that structures 302 consume within device 10 is minimized. Another suitable arrangement is shown in FIG. 32. In the illustrative arrangement of FIG. 32, structures 302 extend along the longitudinal dimension of housing wall 12. If desired, combinations of these types of arrangements may be used (e.g., using one or more discrete hard stop structures, using longer or shorter longitudinally extending structures, etc.).

Figure 33:
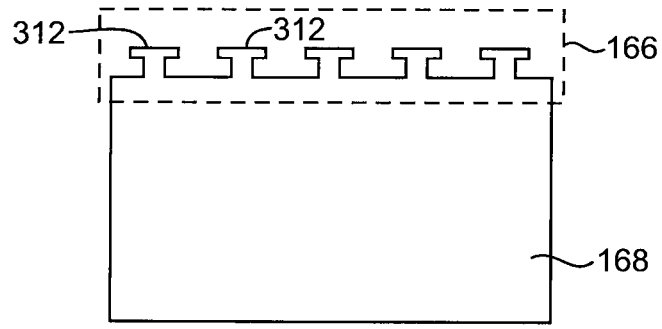
FIGS. 33, 34, and 35 are side views of illustrative frame strut engagement features that may be used to help secure overmolded frame members to frame struts in accordance with an embodiment of the present invention.
Figure 34:
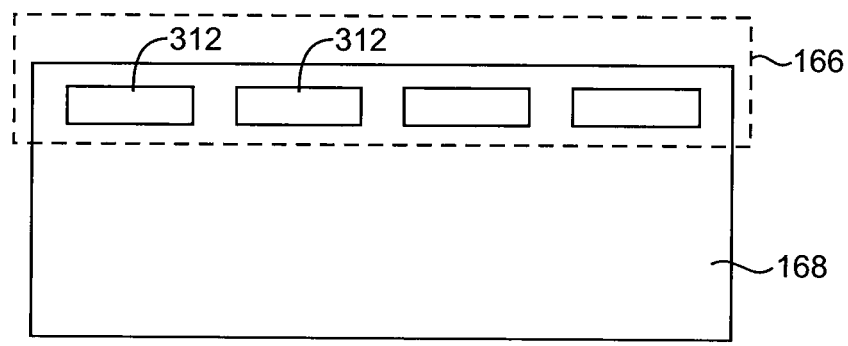
Figure 35:
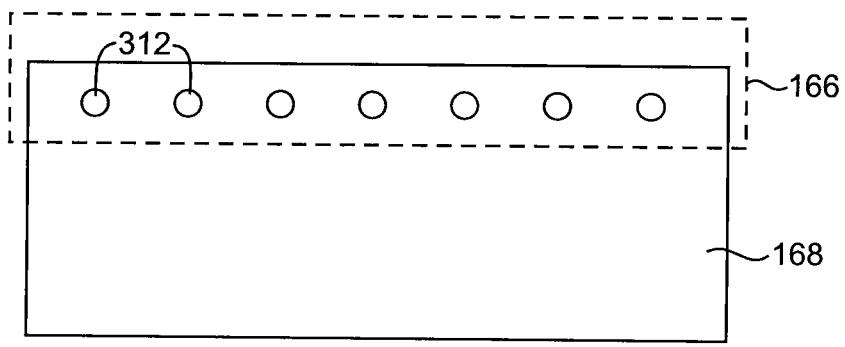

As shown in FIG. 33, frame struts 168 may have interlocking features 312 that help engage frame members 166. Interlocking features 312 may have any suitable shape that helps engage the plastic material (or other suitable material) of which frame members 166 are formed. In the example of FIG. 33, interlocking features 312 are formed from protrusions that form open holes. In FIG. 34, interlocking features 312 are formed from rectangular holes. In the example of FIG. 35, interlocking features 312 are formed from round holes. The holes of FIGS. 34 and 35 are closed, but in general open holes, closed holes, holes of different shapes or different combinations of shapes or any other suitable engagement patterns may be formed in frame struts 168. The examples of FIGS. 33, 34, and 35 are merely illustrative.

Gasket 146 (FIG. 38) may be formed as an integral portion of the frame 68. With one suitable arrangement, which is shown in FIGS. 36, 37, and 38, frame 68 is formed using a two-shot overmolding process.

Figure 36:
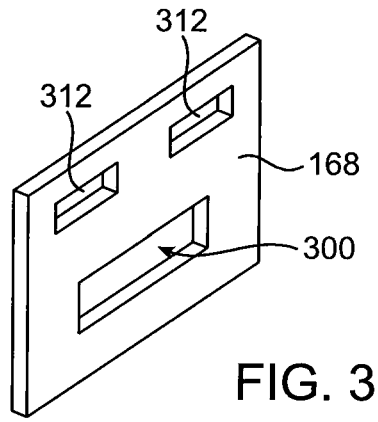
FIG. 36 is a perspective view of a portion of an illustrative frame strut having engagement features in accordance with an embodiment of the present invention.

Initially, sheet metal or other suitable materials are used to form frame struts 168 (FIG. 36). As shown in FIG. 36, frame struts 168 may have holes or other engagement features 312 and holes such as hole 300 that correspond to holes 196 on clips 112.

Figure 37:
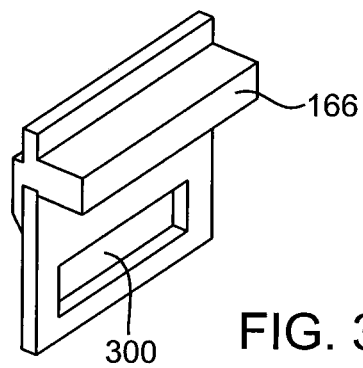
FIG. 37 is a perspective view of the frame strut of FIG. 36 on which a plastic frame member 166 has been formed using a first shot of a two-shot overmolding process in accordance with an embodiment of the present invention.

In a first shot of a two-shot overmolding process, a relatively rigid plastic may be overmolded on top of frame struts 168 to form frame member 166, as shown in FIG. 37. Any suitable plastic may be used to form frame members 166. As an example, a polymer such as Resin No. 1622 (known as an Ixef® polymer) from Solvay Advanced Polymers of Dearborn Mich. may be used.

Figure 38:
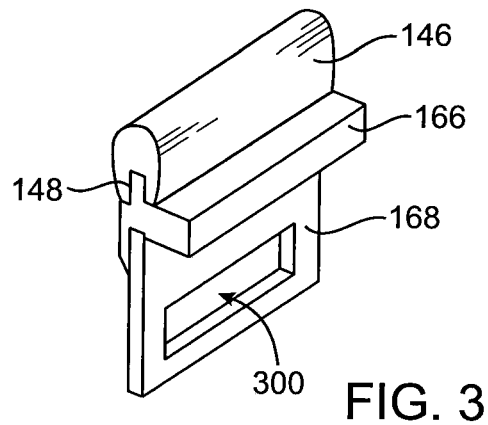
FIG. 38 is a perspective view of the frame strut and frame member of FIG. 37 on which a gasket has been integrally formed using a second shot of the two-shot overmolding process in accordance with an embodiment of the present invention.

After frame members 166 have been formed on top of frame struts 168, a second shot of the two-shot overmolding process may be used to form gasket 146, as shown in FIG. 38. Gasket 146 may be formed from any suitable elastomeric material (e.g., rubber, silicone, etc.). With one suitable arrangement, gasket 146 may be formed from a thermoplastic elastomeric (TPE) such as a thermoplastic polyurethane polymer. Because gasket 146 is formed as part of a two-shot overmolding process, gasket 146 adheres to frame member 166. Frame struts 168, frame members 166, and gasket 146 therefore form an integral part. Because gasket 146 need not be separately assembled into device 10 during manufacturing, the formation of the integral structure including gasket 146, frame member 166, and frame struts 168 helps reduce complexity during manufacturing operations.

The foregoing is merely illustrative of the principles of this invention and various modifications can be made by those skilled in the art without departing from the scope and spirit of the invention.

What is claimed is:

1. A portable electronic device, comprising:
   an upper housing assembly having a frame with a lower surface;
   a lower housing assembly having a hard stop structure with an upper surface against which the lower surface bears when the upper housing assembly and lower housing assembly are assembled, wherein the frame comprises a metal frame strut that defines the lower surface, wherein the metal frame strut comprises engagement features, wherein the frame further comprises a plastic overmolded frame member that is molded over the metal frame strut and that engages at least some of the engagement features of the metal frame strut, wherein the lower housing assembly comprises a spring prong, wherein the engagement features of the metal frame strut comprise at least one hole in the metal frame strut through which the spring prong protrudes;
   a gasket that is molded over the plastic overmolded frame member, wherein the plastic overmolded frame member defines a shelf; and
   a display structure in the upper housing assembly that is mounted to the shelf and that is in contact with the gasket.

2. The portable electronic device defined in claim 1 wherein the lower housing assembly comprises a device housing and wherein the hard stop structure comprises a protrusion of the device housing.

3. The portable electronic device defined in claim 2 wherein the device housing and protrusion are formed of plastic.

4. The portable electronic device defined in claim 3 wherein the protrusion is formed as an integral portion of the device housing.

5. The portable electronic device defined in claim 1 wherein the gasket is formed from a thermoplastic elastomer that is an integral portion of the frame.

6. The portable electronic device defined in claim 1 wherein the engagement features of the metal frame strut comprise at least one through-hole in a surface of the metal frame strut and wherein the plastic overmolded frame member passes through the at least one through-hole in the surface of the metal frame strut.

7. The portable electronic device defined in claim 1 wherein the engagement features of the metal frame strut comprise at least first and second through-holes in a surface of the metal frame strut and wherein there is a continuous loop of the plastic overmolded frame member that starts on a first side of the surface at a first location, that extends to a second location by passing through the first through-hole to a second side of the surface, that extends to a third location by running along the second side of the surface, that extends to a fourth location by passing through the second through-hole back to the first side of the surface, and that returns to the first location by running along the first side of the surface.

8. The portable electronic device defined in claim 1, wherein:
the metal frame strut has first portions on a first side of the hole in the metal frame strut;
the metal frame strut has second portions on a second side of the hole in the metal frame strut;
the spring prong has first curved portions that are curved in a first direction into the hole that is towards the metal frame strut; and
the spring prong has second curved portions that are curved in a second direction that is opposite the first direction and that is away from the metal frame strut.

9. The portable electronic device defined in claim 8, wherein:
the first portions of the metal frame strut bear against the first curved portions of the spring prong to retard motion of the upper housing assembly away from the lower housing assembly when the upper and lower housing assemblies are assembled; and
the second portions of the metal frame strut bear against the second curved portions of the spring prong to retard motion of the upper housing toward the lower housing assembly when the upper and lower housing assemblies are assembled.

10. The portable electronic device defined in claim 1 wherein the gasket is molded at least partially around the metal frame strut such that a portion of the metal frame strut is disposed between first and second portions of the gasket.

11. A portable electronic device, comprising:
a first portion having a frame with a first surface;
a second portion having a structure with a second surface against which the first surface bears when the first and second portions are assembled, wherein the frame comprises a frame strut that defines the first surface, wherein the frame strut comprises at least one engagement feature, wherein the frame further comprises a plastic frame member that engages the engagement feature of the frame strut, wherein the second portion comprises a spring that protrudes through a hole in the frame strut when the first and second portions are assembled;
a gasket disposed over the plastic frame member, wherein the plastic frame member defines a shelf; and
a display structure in the first portion that is mounted to the shelf and that is in contact with the gasket, wherein the engagement feature of the frame strut comprises at least first and second through-holes in a surface of the frame strut and wherein there is a continuous loop of the plastic frame member that starts on a first side of the surface at a first location, that extends to a second location by passing through the first through-hole to a second side of the surface, that extends to a third location by running along the second side of the surface, that extends to a fourth location by passing through the second through-hole back to the first side of the surface, and that returns to the first location by running along the first side of the surface.

12. A portable electronic device, comprising:
a first portion having a frame with a first surface;
a second portion having a structure with a second surface against which the first surface bears when the first and second portions are assembled, wherein the frame comprises a frame strut that defines the first surface, wherein the frame strut comprises at least one engagement feature, wherein the frame further comprises a plastic frame member that engages the engagement feature of the frame strut, wherein the second portion comprises a spring that protrudes through a hole in the frame strut when the first and second portions are assembled;
a gasket disposed over the plastic frame member, wherein the plastic frame member defines a shelf; and
a display structure in the first portion that is mounted to the shelf and that is in contact with the gasket, wherein:
the frame strut has first portions on a first side of the hole in the frame strut;
the frame strut has second portions on a second side of the hole in the frame strut;
the spring has first curved portions that are curved in a first direction into the hole that is towards the frame strut; and
the spring has second curved portions that are curved in a second direction that is opposite the first direction and that is away from the frame strut.

13. The portable electronic device defined in claim 12, wherein:
the first portions of the frame strut bear against the first curved portions of the spring to retard motion of the first portion away from the second portion when the first and second portions are assembled; and
the second portions of the frame strut bear against the second curved portions of the spring to retard motion of the first portion toward the second portion when the first and second portions are assembled.

* * * * *